United States Patent
Asami et al.

(10) Patent No.: US 11,309,051 B2
(45) Date of Patent: Apr. 19, 2022

(54) MEMORY SYSTEM THAT USES NAND FLASH MEMORY AS A MEMORY CHIP

(71) Applicant: Kioxia Corporation, Tokyo (JP)

(72) Inventors: Shohei Asami, Fujisawa (JP); Takehiko Amaki, Yokohama (JP)

(73) Assignee: Kioxia Corporation, Tokyo (JP)

( * ) Notice: Subject to any disclaimer, the term of this patent is extended or adjusted under 35 U.S.C. 154(b) by 29 days.

(21) Appl. No.: 17/022,274

(22) Filed: Sep. 16, 2020

(65) Prior Publication Data
US 2021/0295941 A1    Sep. 23, 2021

(30) Foreign Application Priority Data

Mar. 19, 2020  (JP) .............................. JP2020-049667

(51) Int. Cl.
| | |
|---|---|
| G11C 16/06 | (2006.01) |
| G11C 29/42 | (2006.01) |
| G11C 29/44 | (2006.01) |
| G11C 29/12 | (2006.01) |
| G11C 16/10 | (2006.01) |
| G11C 16/26 | (2006.01) |
| G11C 16/04 | (2006.01) |
| G11C 29/50 | (2006.01) |

(52) U.S. Cl.
CPC .......... *G11C 29/42* (2013.01); *G11C 16/0433* (2013.01); *G11C 16/10* (2013.01); *G11C 16/26* (2013.01); *G11C 29/12005* (2013.01); *G11C 29/44* (2013.01); *G11C 29/50004* (2013.01); *G11C 2029/1202* (2013.01)

(58) Field of Classification Search
CPC ..... G11C 29/42; G11C 16/0433; G11C 16/10; G11C 16/26; G11C 29/12005; G11C 29/44; G11C 29/50004; G11C 2029/1202
See application file for complete search history.

(56) References Cited

U.S. PATENT DOCUMENTS

| | | | |
|---|---|---|---|
| 8,032,810 B2 | 10/2011 | Ishikawa et al. | |
| 8,984,375 B2 | 3/2015 | Hashimoto | |
| 9,836,349 B2 | 12/2017 | Lien et al. | |
| 10,509,720 B2* | 12/2019 | Kim ..................... | G11C 29/028 |

(Continued)

FOREIGN PATENT DOCUMENTS

| | | |
|---|---|---|
| JP | 4791912 B2 | 7/2011 |
| JP | 5740296 B2 | 5/2015 |

*Primary Examiner* — Tuan T Nguyen
(74) *Attorney, Agent, or Firm* — Oblon, McClelland, Maier & Neustadt, L.L.P.

(57) ABSTRACT

According to one embodiment, a memory system includes: a memory chip including a first memory block and first word lines, the first memory block including a first memory string which includes first memory cells that are coupled in series, the first word lines being respectively coupled to gates of the first memory cells; a memory controller coupled to an external device, controlling the memory chip, and capable of performing an error checking and correcting process of data. When a write instruction is received from the external device, the memory controller is configured to perform a write operation on a second memory cell which is one of the first memory cells, and to perform a read verify operation including a read process and the ECC process on a third memory cell which is one of the first memory cells.

20 Claims, 28 Drawing Sheets

(56) References Cited

U.S. PATENT DOCUMENTS

2020/0051649 A1* 2/2020 Her .................... G11C 16/30
2020/0319953 A1* 10/2020 Kim ................. G06F 12/0882
2021/0257037 A1* 8/2021 Zhang ............... G11C 11/5628

* cited by examiner

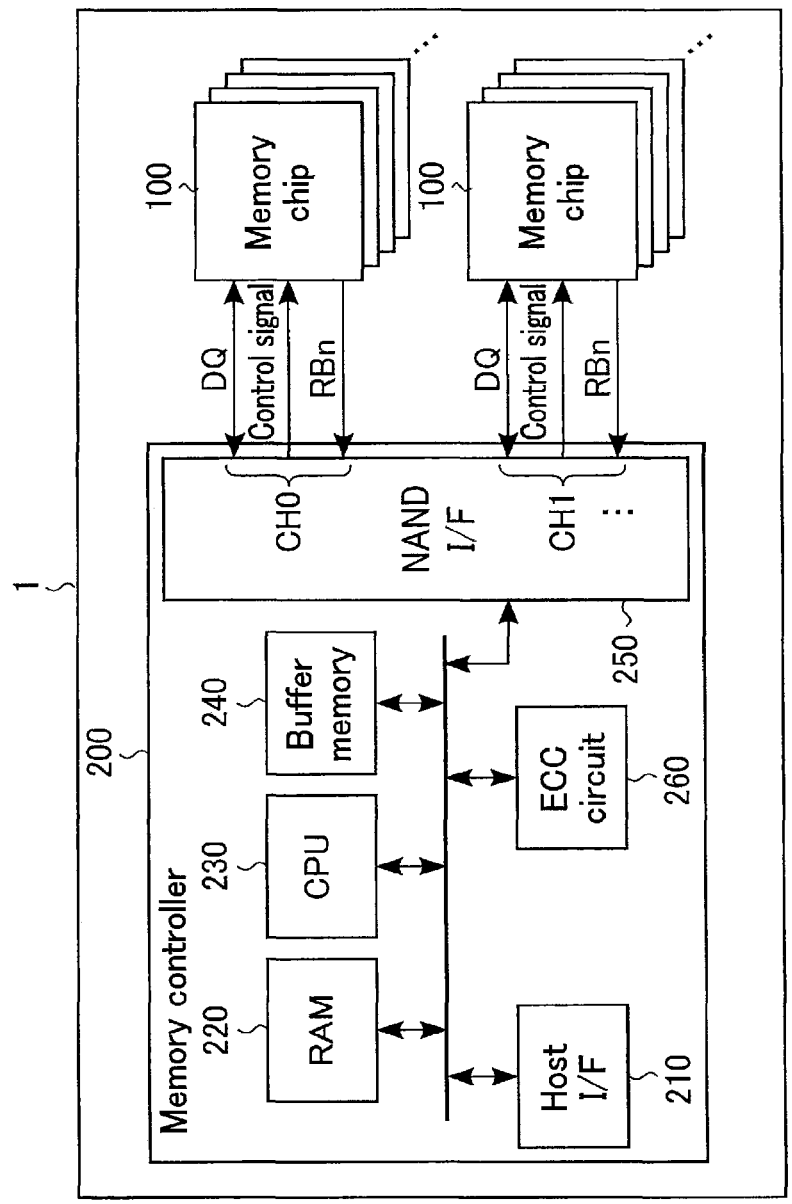
F I G. 1

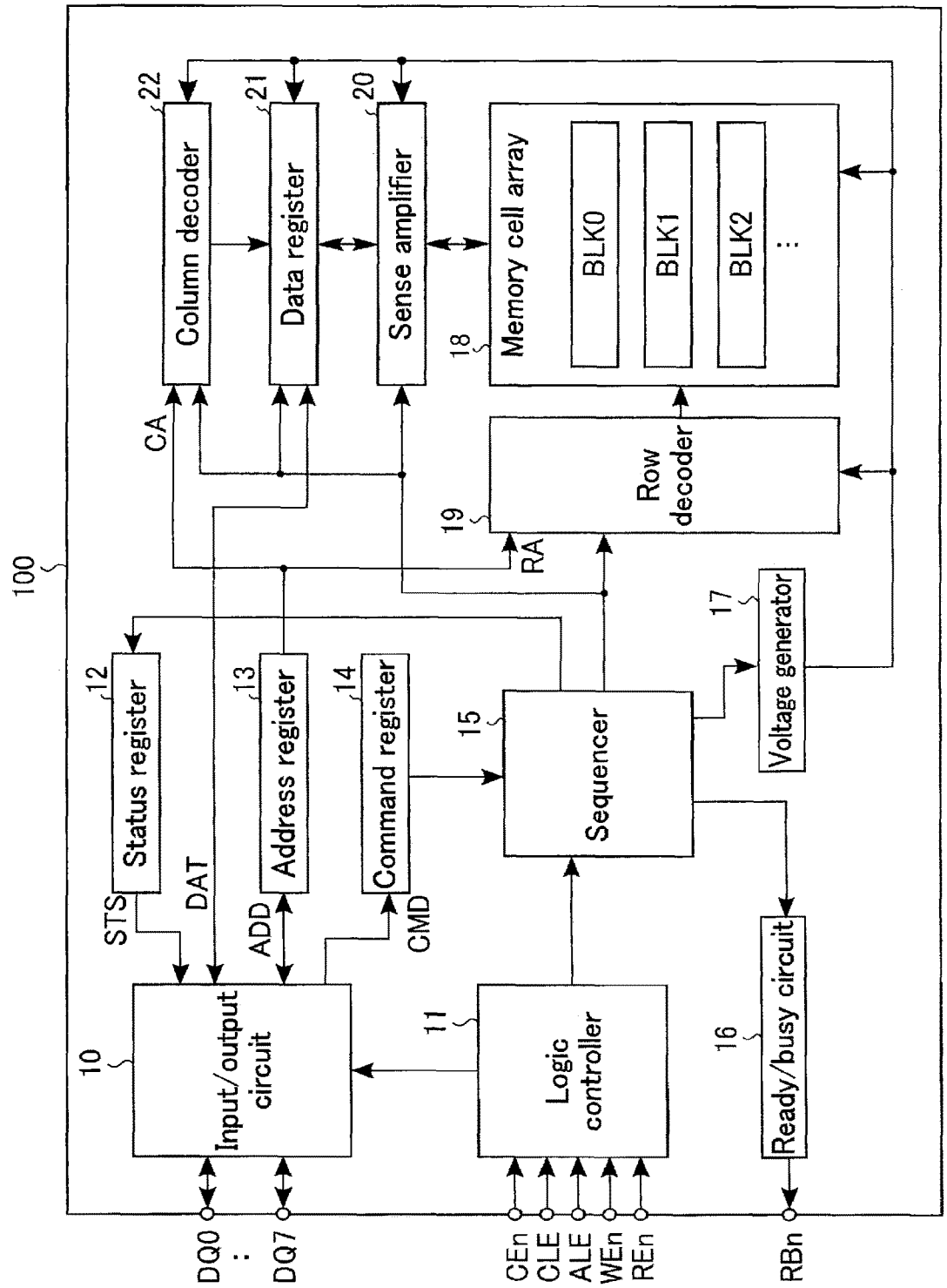
F I G. 2

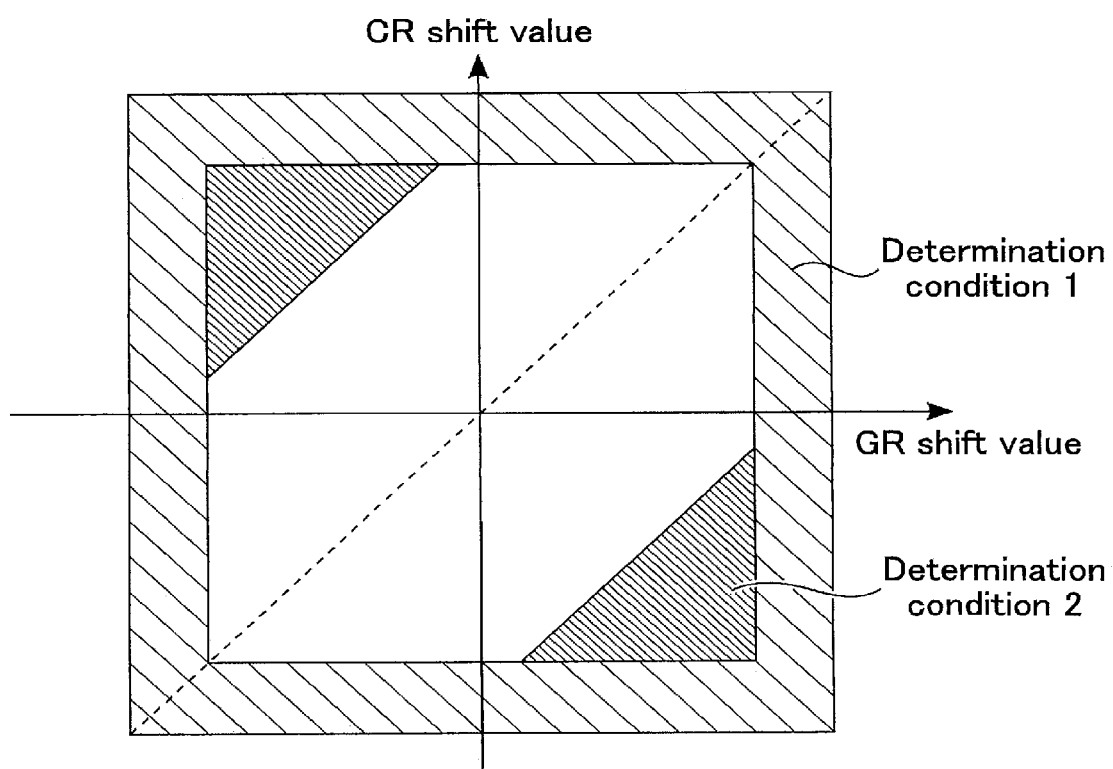
F I G. 10

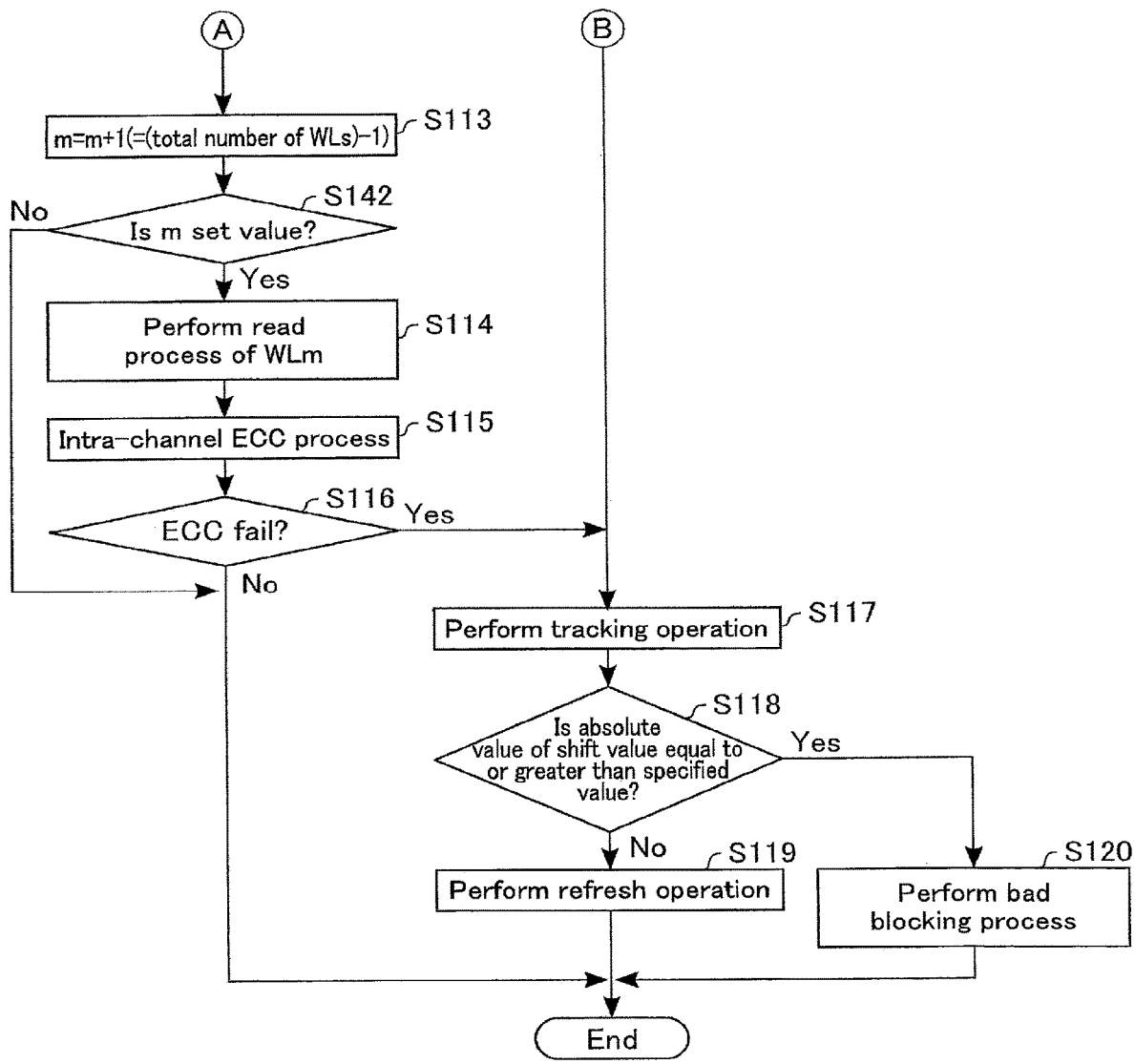
F I G. 17

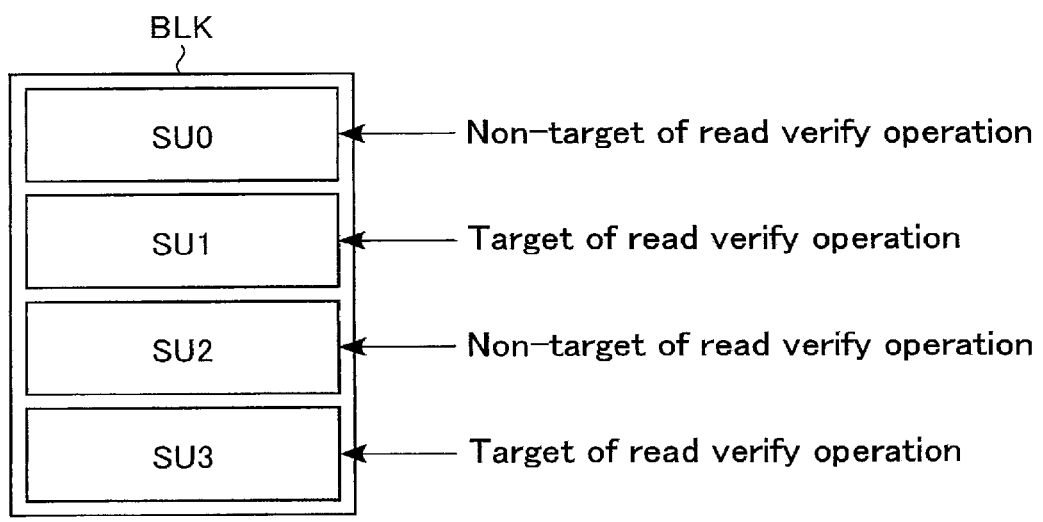
F I G. 18

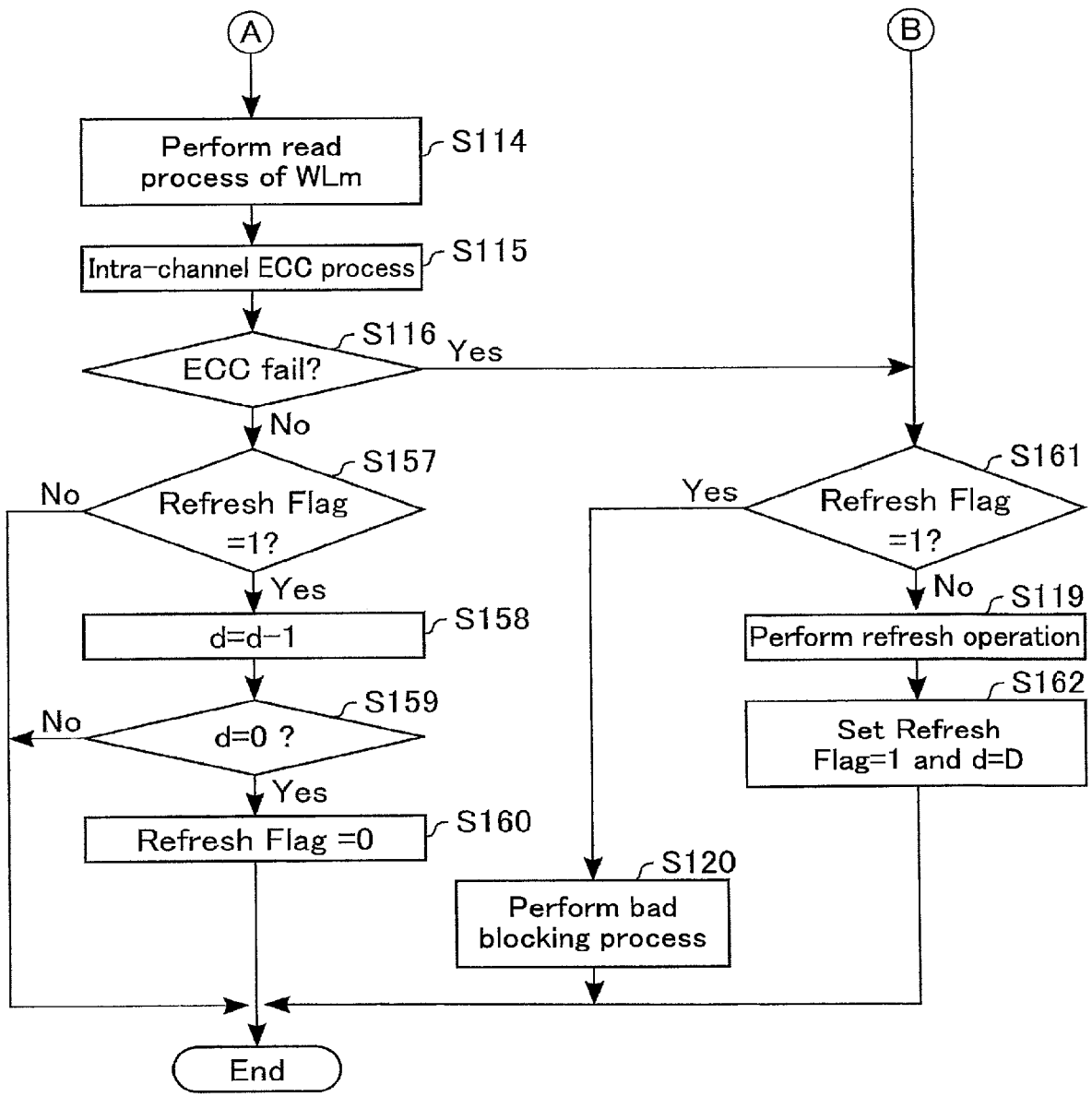
F I G. 27

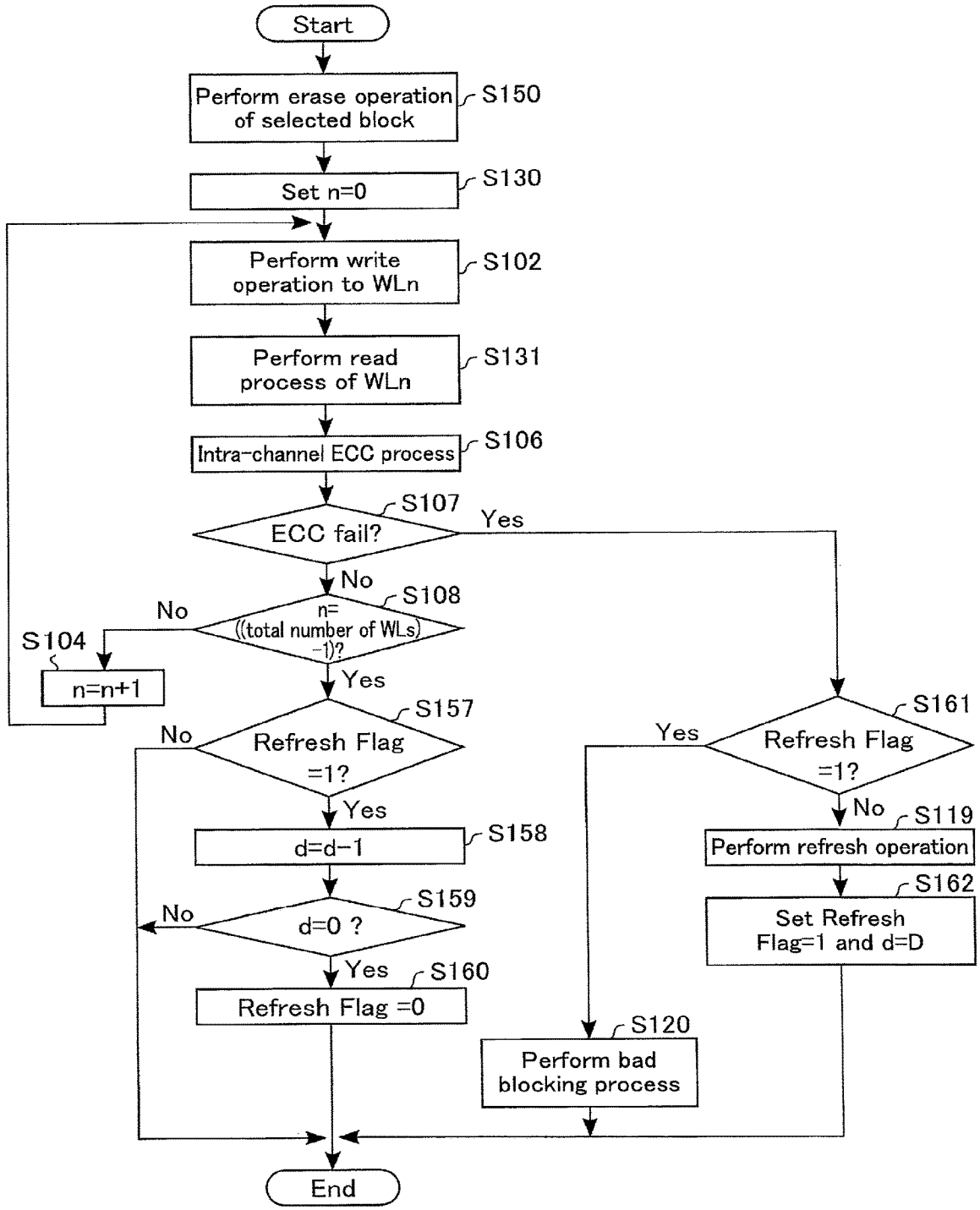
F I G. 28

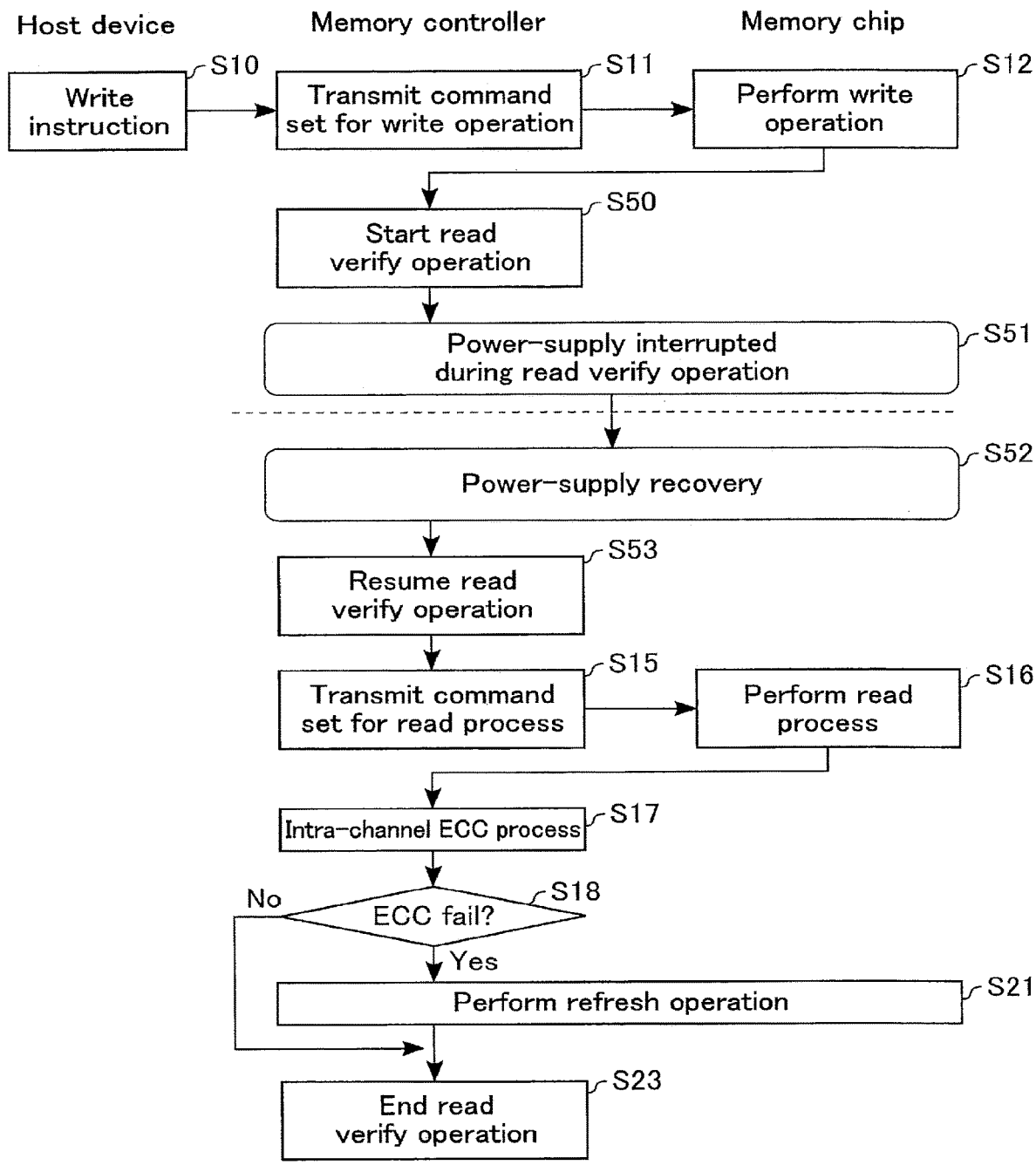
F I G. 29

MEMORY SYSTEM THAT USES NAND FLASH MEMORY AS A MEMORY CHIP

CROSS-REFERENCE TO RELATED APPLICATIONS

This application is based upon and claims the benefit of priority from Japanese Patent Application No. 2020-049667, filed Mar. 19, 2020, the entire contents of which are incorporated herein by reference.

FIELD

Embodiments described herein relate generally to a memory system.

BACKGROUND

A memory system that uses a NAND flash memory as a memory chip is known.

BRIEF DESCRIPTION OF THE DRAWINGS

FIG. 1 is a block diagram of a memory system according to a first embodiment.

FIG. 2 is a block diagram of a memory chip included in a memory system according to the first embodiment.

FIG. 10 is a diagram showing an example of determination conditions of a bad blocking process in the memory system according to the first embodiment.

FIGS. 16 and 17 are flowcharts showing a write operation and a read verify operation in a memory chip included in the memory system according to the second example of the third embodiment.

FIG. 18 is a diagram showing an example of a target of a read verify operation in a memory chip included in a memory system according to a third example of the third embodiment.

FIGS. 26 and 27 are flowcharts showing a write operation and a read verify operation in a memory chip included in the memory system according to the third example of the fourth embodiment.

FIG. 28 is a flowchart showing a write operation and a read verify operation in a memory chip included in a memory system according to a fourth example of the fourth embodiment.

FIG. 29 is a flowchart showing a write operation and a read verify operation in a memory system according to a fifth embodiment.

DETAILED DESCRIPTION

Figure 3:
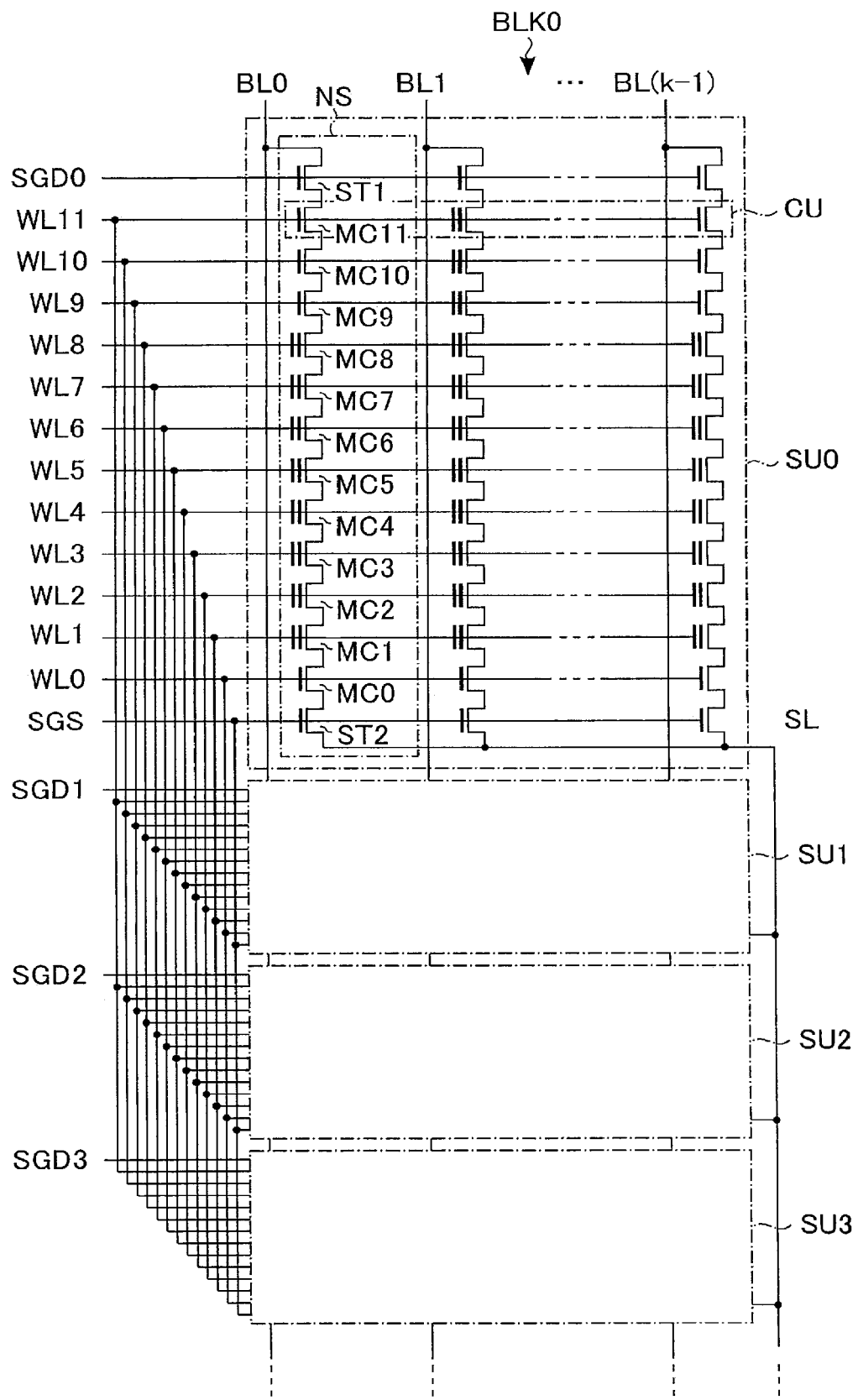
FIG. 3 is a circuit diagram of a memory cell array in the memory chip included in the memory system according to the first embodiment.

In general, according to one embodiment, a memory system includes: a memory chip including a first memory block and a plurality of first word lines, the first memory block including a first memory string which includes a plurality of first memory cells that are coupled in series, the first word lines being respectively coupled to gates of the first memory cells; a memory controller coupled to an external device, controlling the memory chip, and capable of performing an error checking and correcting (ECC) process of data read from the memory chip. When a write instruction is received from the external device, the memory controller is configured to perform a write operation on a second memory cell which is one of the first memory cells, and to perform a read verify operation including a read process and the ECC process on a third memory cell which is one of the first memory cells.

Hereinafter, embodiments will be described with reference to the accompanying drawings. The drawings are schematic. In the description that follows, components having substantially the same functions and configurations will be denoted by the same reference symbols. A numeral that follows letters constituting a reference symbol is used to distinguish between components referred to by reference symbols that include the same letters and have a similar configuration. If components represented by reference symbols that include the same letters need not be distinguished from one another, such components are assigned reference symbols that include only the same letters.

1. First Embodiment

Hereinafter, a memory system according to a first embodiment will be described. In the description that follows, a case will be described where the memory system is a solid-state drive (SSD).

1.1. Configuration

1.1.1. Configuration of Memory System

First, an example overall configuration of a memory system 1 will be described with reference to FIG. 1. FIG. 1 is a block diagram showing an overall configuration of the memory system 1.

The memory system 1 comprises a plurality of memory chips 100 and a memory controller 200. The memory system 1 is coupled to an unillustrated host device.

The memory chips 100 are non-volatile flash memories, which are capable of storing data in a non-volatile manner. Each of the memory chips 100 is capable of operating independently. The number of memory chips 100 included in the memory system 1 may be freely designed. There should be at least one memory chip 100. Hereinafter, a case will be described where the memory chips 100 are three-dimensional NAND flash memories. The memory chips 100 may be planar NAND flash memories, or other types of non-volatile memories.

The memory controller 200 is, for example, a system on a chip (SoC). The functions of the memory controller 200 may be implemented by dedicated circuits. Alternatively, the functions of the memory controller 200 may be implemented by execution of firmware by a processor. The memory controller 200 instructs the memory chips 100 to perform a data read operation, a data write operation, a data erase operation, etc. The memory controller 200 is capable of operating a plurality of memory chips 100 as a single virtual memory chip 100. Such an operation scheme will be referred to as an "inter-channel Redundant Array of Inexpensive Disks (RAID)".

When, for example, inter-channel RAID is implemented, the memory controller 200 makes one or more items of write data (user data) into a predetermined data size by coupling and/or division. The memory controller 200 attaches an error-correcting code for error correction to user data of a predetermined data size. Hereinafter, an error-correcting code corresponding to the inter-channel RAID will be referred to as "inter-channel parity". Data containing user data that has been made into a predetermined data size by coupling and/or division and inter-channel parity attached thereto will be referred to as an "inter-channel ECC frame". That is, the memory controller 200 couples one or more items of user data, attaches inter-channel parity thereto, and thereby generates a single inter-channel ECC frame. The memory controller 200 is capable of writing a single inter-channel ECC frame into a plurality of memory chips 100 in a distributed manner. In other words, the memory controller 200 divides the user data and the inter-channel parity into a plurality of segments corresponding to the number of the memory chips 100 to be write targets (i.e., the number of channels CH to be selected). The memory controller 200 is capable of writing the segments of the user data and the inter-channel parity into the respective memory chips 100.

The memory controller 200 includes a host interface circuit 210, an embedded memory (RAM) 220, a processor (central processing unit; CPU) 230, a buffer memory 240, a NAND interface circuit 250, and an ECC circuit 260.

The host interface circuit 210 is coupled to the host device via a host bus, and controls communications between the memory controller 200 and the host device. The host interface circuit 210 transfers, for example, an instruction and data received from the host device to the CPU 230 and the buffer memory 240, respectively. In response to an instruction from the CPU 230, the host interface circuit 210 transfers data, etc. in the buffer memory 240 to the host device.

The RAM 220 is, for example, a semiconductor memory such as a DRAM. The RAM 220 stores firmware, various types of management tables, etc. The RAM 220 is used as a working area of the CPU 230.

The CPU 230 controls the entire operation of the memory controller 200. More specifically, the CPU 230 controls the host interface circuit 210, the RAM 220, the buffer memory 240, the NAND interface circuit 250, and the ECC circuit 260. For example, the CPU 230 issues a write command based on the received write instruction, and transmits the issued write command to the NAND interface circuit 250. A similar operation is performed in the case of a read instruction and an erase instruction. The CPU 230 performs various processes to manage the memory space of the memory chips 100, such as wear leveling.

The buffer memory 240 temporarily stores the received read data, the received write data, etc.

The NAND interface circuit 250 is coupled to the memory chips 100 via a NAND bus. The NAND interface circuit 250 controls communications between the memory controller 200 and the memory chips 100. The NAND interface circuit 250 includes a plurality of channels CH (CH0, CH1, . . . ). A plurality of memory chips 100 are coupled to each of the channels CH. In inter-channel RAID, for example one of the memory chips 100 that are coupled to each of the channels CH, is selected. That is, a plurality of memory chips 100 that are respectively coupled to different channels CH are selected.

The NAND interface circuit 250 transmits, for example, various control signals based on an instruction received from the CPU 230 to the memory chip 100. The NAND interface circuit 250 transmits a ready/busy signal received from the memory chip 100 to the CPU 230. The NAND interface circuit 250 transmits and receives a signal DQ to and from the memory chip 100. The ready/busy signal is a signal that notifies the memory controller 200 whether or not the memory chip 100 is in a state where an instruction from the memory controller 200 is ready to be received. For example, the ready/busy signal is set to a High ("H") level when the memory chip 100 is in a state where an instruction from the memory controller 200 is ready to be received (i.e., a ready state), and to a Low ("L") level when the memory chip 100 is in a state where an instruction from the memory controller 200 is not ready to be received (i.e., a busy state). The signal DQ is, for example, an eight-bit signal. The signal DQ contains a command, an address, data, etc. More specifically, in a write operation, for example, the signal DQ transferred to the memory chip 100 includes a write command issued by the CPU 230, an address, and write data in the buffer memory 240. In a read operation, the signal DQ transferred from the memory controller 200 to the memory chip 100 includes a read command issued by the CPU 230 and an address. The signal DQ transferred from the memory chip 100 to the memory controller 200 contains read data.

The ECC circuit 260 performs an error checking and correcting (ECC) process for data encoding and decoding. An ECC process for encoding data will also be referred to as an "ECC process for encoding". An ECC process for decoding data will also be referred to as an "ECC process for decoding". If an ECC process for encoding and an ECC process for decoding need not be distinguished, they will simply be referred to as an "ECC process".

ECC processes performed by the ECC circuit 260 are classified into an ECC process corresponding to the inter-channel RAID (hereinafter also referred to as an "inter-channel ECC process"), and an ECC process performed on data on each memory chip (hereinafter also referred to as an "intra-channel ECC process").

When, for example, an inter-channel ECC process is performed, the ECC circuit 260 generates, in data writing, inter-channel parity based on write data (user data) of a predetermined data size as an inter-channel ECC process for encoding. The ECC circuit 260 generates inter-channel parity based on, for example, an encoding method such as RS (Reed-Solomon) codes. The ECC circuit 260 attaches inter-channel parity to the user data, and thereby generates an inter-channel ECC frame. The generated inter-channel ECC frame is written into a plurality of memory chips 100 in a distributed manner via a plurality of channels CH. In data reading, the ECC circuit 260 performs error correction of the read data based on inter-channel parity of an inter-channel ECC frame read from a plurality of memory chips 100, as an inter-channel ECC process for decoding. In the case of inter-channel RAID, even if, for example, user data (segments of an inter-channel ECC frame) cannot be read from some of the memory chips 100, namely, even if some of the items of user data are missing, the ECC circuit 260 is capable of performing an inter-channel ECC process based on user data and inter-channel parity read from another memory chips 100 if the number of missing items of the user data is equal to or less than a predetermined number. It is thereby possible to reconstruct the missing data.

When, for example, an intra-channel ECC process is performed, the ECC circuit 260 generates an error-correcting code (hereinafter also referred to as "intra-channel parity") for data to be written into the memory chip 100 as an intra-channel ECC process for encoding. The intra-channel parity is generated for each memory chip. The ECC circuit 260 generates, for example, intra-channel parity based on an encoding method such as Bose-Chaudhuri-Hocquenghem (BCH) codes or low-density parity-check (LDPC) codes. The ECC circuit 260 attaches intra-channel parity to data to be written into the memory chip 100. Hereinafter, data containing data to be written into the memory chip 100 and intra-channel parity attached thereto will be referred to as an "intra-channel ECC frame". In data reading, the ECC circuit 260 performs, as an intra-channel ECC process for decoding, error correction of the read data (user data) based on the intra-channel parity contained in the data (intra-channel ECC frame) read from the memory chip 100.

In inter-channel RAID, when data is written into each memory chip 100, the ECC circuit 260 attaches inter-channel parity to write data (user data) of a predetermined data size as an inter-channel ECC process for encoding, and generates an inter-channel ECC frame. Subsequently, the ECC circuit 260 generates, as an intra-channel ECC process for encoding, an intra-channel ECC frame by attaching the intra-channel parity to each of the segments of the inter-channel ECC frame. Accordingly, the data (intra-channel ECC frame) to be written into each memory chip 100 contains a segment of the inter-channel ECC frame (a segment of the user data and/or a segment of the inter-channel parity) and the intra-channel parity.

In inter-channel RAID, when data is read from the memory chips 100, the ECC circuit 260 performs an intra-channel ECC process for decoding data in each memory chip 100. More specifically, the ECC circuit 260 performs error correction on the intra-channel ECC frames, namely, segments of the inter-channel ECC frame. If error correction cannot be performed in the intra-channel ECC process for decoding, the ECC circuit 260 collects the segments of the inter-channel ECC frame and performs an inter-channel ECC process for decoding. More specifically, the ECC circuit 260 performs error correction of the inter-channel ECC frame.

1.1.2 Configuration of Memory Chip

Next, an example of a detailed configuration of the memory chip 100 will be described with reference to FIG. 2. FIG. 2 is a block diagram showing a detailed configuration of the memory chip 100. In the example of FIG. 2, some of the couplings between the blocks are indicated by arrows; however, the couplings between the blocks are not limited thereto.

The memory chip 100 includes an input/output circuit 10, a logic controller 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input/output circuit 10 performs bidirectional communications of a signal DQ between the memory chip 100 and the memory controller 200 via terminals DQ0 to DQ7. The input/output circuit 10 transmits the data DAT received from the memory controller 200 to the data register 21, transmits the address ADD to the address register 13, and transmits the command CMD to the command register 14.

The input/output circuit 10 also transmits status information STS received from the status register 12, the data DAT received from the data register 21, the address ADD received from the address register 13, etc. to the memory controller 200.

The logic controller 11 receives control signals from the memory controller 200 via the terminals CEn, CLE, ALE, WEn, and REn. The logic controller 11 controls the input/output circuit 10 and the sequencer 15 based on the received control signals. Examples of such control signals include a chip enable signal, a command latch enable signal, an address latch enable signal, a write enable signal, and a read enable signal. The logic controller 11 receives a chip enable signal from the terminal CEn. The chip enable signal is a signal to enable the memory chip 100. The chip enable signal is asserted at, for example, the "L" level. The logic controller 11 receives a command latch enable signal from the terminal CLE. The command latch enable signal is a signal indicating that the signal DQ is a command. The command latch enable signal is asserted at, for example, the "H" level. The logic controller 11 receives an address latch enable signal from the terminal ALE. The address latch enable signal is a signal indicating that the signal DQ is an address. The address latch enable signal is asserted at, for example, the "H" level. The logic controller 11 receives a write enable signal from the terminal WEn. The write enable signal is a signal to fetch a received signal into the memory chip 100. The write enable signal is asserted at, for example, the "L" level whenever the signal DQ is received from the memory controller 200. Accordingly, whenever the write enable signal is toggled, the signal DQ is fetched into the memory chip 100. The logic controller 11 receives a read enable signal from the terminal REn. The read enable signal is a signal for the memory controller 200 to read data from the memory chip 100. The read enable signal is asserted at, for example, the "L" level. Accordingly, the memory chip 100 outputs a signal DQ to the memory controller 200 based on the toggled read enable signal.

The status register 12 temporarily stores, for example, status information STS in a write operation, a read operation, and an erase operation. The status register 12 notifies the memory controller 200 whether or not the operation has been completed normally.

The address register 13 temporarily stores the received address ADD. The address register 13 transfers the row address RA to the row decoder 19. The address register 13 transfers a column address CA to the column decoder 22.

The command register 14 temporarily stores the received command CMD. The command register 14 transfers the stored command CMD to the sequencer 15.

The sequencer 15 controls the entire operation of the memory chip 100 based on the received command CMD. More specifically, the sequencer 15 controls, for example, the status register 12, the ready/busy circuit 16, the voltage generator 17, the row decoder 19, the sense amplifier 20, the data register 21, the column decoder 22, etc. based on the received command CMD.

The ready/busy circuit 16 transmits a ready/busy signal to the memory controller 200 via the terminal RBn, based on an operation status of the sequencer 15.

The voltage generator 17 generates voltages required for the write operation, the read operation, and the erase operation, and supplies the generated voltages to, for example, the memory cell array 18, the row decoder 19, the sense amplifier 20, the data register 21, the column decoder 22, etc.

The memory cell array 18 includes a plurality of blocks BLK (BLK0, BLK1, BLK2, . . . ). The number of blocks BLK in the memory cell array 18 is designed to be any number. Each of the blocks BLK includes a plurality of non-volatile memory cell transistors each associated with a row and a column (hereinafter also referred to as "memory cells"). The memory cell array 18 will be described in detail later.

The row decoder 19 decodes a row address RA received from the memory controller 200. Based on the result of the decoding, the row decoder 19 selects an interconnect extending in a row direction in the memory cell array 18. More specifically, the row decoder 19 applies voltages to word lines and select gate lines, thereby selecting memory cells aligned in the row direction.

During a read operation, the sense amplifier 20 amplifies a voltage read from the memory cell array 18 to a level that can be handled as data. The sense amplifier 20 transmits the read data to the data register 21. In a write operation, the sense amplifier 20 applies a voltage corresponding to write data to the memory cell array 18.

The data register 21 includes a plurality of latch circuits (not illustrated). The latch circuits temporarily store write data or read data.

In a write operation, a read operation, an erase operation, etc., the column decoder 22 decodes a column address CA. The column decoder 22 selects latch circuits in the data register 21 based on the result of decoding.

1.1.3. Configuration of Memory Cell Array

Next, an example of a circuit configuration of the memory cell array 18 will be described with reference to FIG. 3. The example in FIG. 3 shows a circuit configuration of a block BLK0; however, the other blocks BLK have a similar configuration.

A block BLK includes, for example, four string units SU0 to SU3. Each string unit SU includes a plurality of NAND strings NS (hereinafter referred to as "memory strings") associated with bit lines BL0 to BL (k−1) (where k is an integer equal to or greater than 2).

Each NAND string NS includes a plurality of memory cell transistors MC (MC0 to MC11) and select transistors ST1 and ST2. Each memory cell transistor MC includes a control gate and a charge storage layer, and stores data in a non-volatile manner. The memory cell transistor MC may be of a MONOS type which uses an insulating layer as the charge storage layer, or of an FG type which uses a conductive layer as the charge storage layer. Each of the select transistors ST1 and ST2 is used to select a string unit SU in various operations.

In the description that follows, an example will be described in which the memory cell transistors MC are of the MONOS type.

In each NAND string NS, the select transistor ST2, the memory cell transistors MC0 to MC11, and the select transistor ST1 are coupled in series. A drain of the select transistor ST1 is coupled to a corresponding bit line BL. A source of the select transistor ST2 is coupled to a source line SL.

Control gates of the memory cell transistors MC0 to MC11 in the same block BLK are commonly coupled to the word lines WL0 to WL11, respectively. Gates of select transistors ST1 in each string unit SU are commonly coupled to a corresponding select gate line SGD. More specifically, gates of a plurality of select transistors ST1 in the string unit SU0 are commonly coupled to a select gate line SGD0. Similarly, gates of select transistors ST1 in the string units SU1 to SU3 are commonly coupled to the corresponding select gate lines SGD1 to SGD3, respectively. Gates of the select transistors ST2 are commonly coupled to the select gate line SGS.

In the above-described circuit configuration of the memory cell array 18, the word lines WL0 to WL5 correspond to lower memory pillars LMP (to be described later), and the word lines WL6 to WL11 correspond to upper memory pillars UMP (to be described later). The bit line BL is shared among a plurality of NAND strings NS in each string unit SU to which the same column address is assigned. The source line SL is shared among, for example, a plurality of blocks BLK.

A group of memory cell transistors MC coupled to a common word line WL in a single string unit SU will be referred to as, for example, a "cell unit CU". The storage capacity of a cell unit CU including memory cell transistors MC that individually store 1-bit data, for example, is defined as "1-page data". A cell unit CU may have a storage capacity of 2 or more pages of data, according to the number of bits of data stored in the memory cell transistor MC.

The circuit configuration of the memory cell array 18 is not limited to the above-described configuration. For example, the numbers of memory cell transistors MC and select transistors ST1 and ST2 included in each NAND string NS may be designed to be any number. The number of string units SU included in each block BLK may be designed to be any number.

One or more dummy word lines may be provided between the word lines WL5 and WL6. If dummy word lines are provided, dummy transistors corresponding to the number of the dummy word lines are provided between the memory cell transistors MC5 and MC6 of each NAND string NS. The dummy transistors have a structure similar to that of the memory cell transistors MC, and are not used for data storage.

1.1.4 Cross-sectional Configuration of Memory Cell Array

Figure 4:
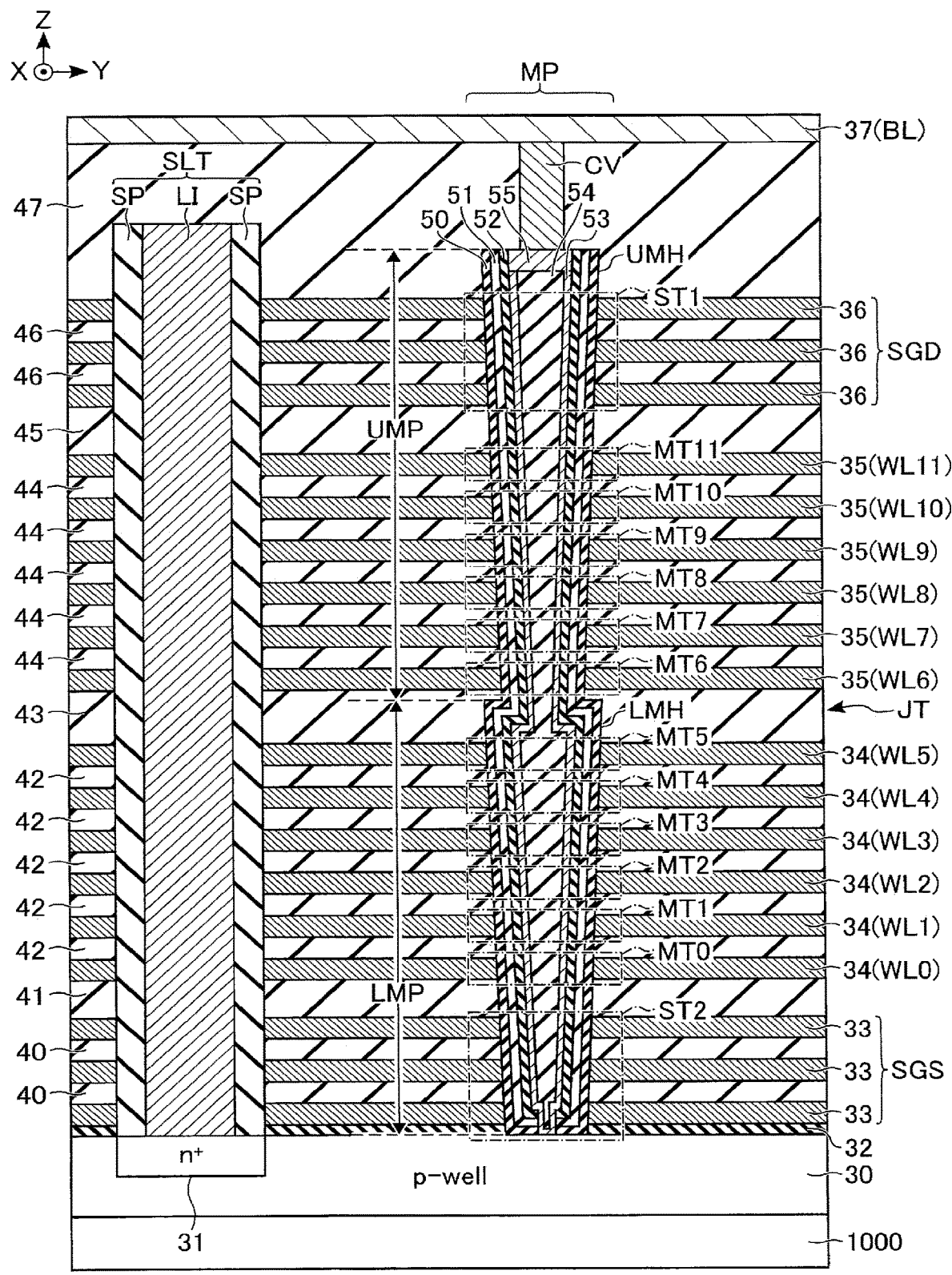
FIG. 4 is a cross-sectional view of a memory cell array in the memory chip included in the memory system according to the first embodiment.

Next, an example of a cross-sectional configuration of the memory cell array 18 will be described with reference to FIG. 4. FIG. 4 is a cross-sectional view of the memory cell array 18.

A p-type well region 30 is provided in the vicinity of a surface of a semiconductor substrate 1000. The p-type well region 30 functions as the source line SL. An $n^+$-type diffusion layer region 31 is provided in the vicinity of a surface of the p-type well region 30. The $n^+$-type diffusion layer region 31 is a diffusion region of n-type impurities. The $n^+$-type diffusion layer region 31 is a region doped with, for example, phosphorus.

An insulating layer 32 is provided on top of the p-type well region 30 and the $n^+$-type diffusion layer region 31. Three conductive layers 33 and two insulating layers 40 are stacked in an alternating manner on top of the insulating layer 32. The conductive layers 33 are formed, for example, in a plate shape extending along the XY plane. The stacked conductive layers 33 function as select gate lines SGS. The number of conductive layers 33 may be designed to be any number. At least one conductive layer 33 should be provided.

An insulating layer 41 is provided on top of the uppermost conductive layer 33. Six conductive layers 34 and five insulating layers 42 are stacked in an alternating manner on top of the insulating layer 41. The conductive layers 34 are formed, for example, in a plate shape extending along the XY plane. The stacked conductive layers 34 respectively function as, in order from the side of the p-type well region 30, word lines WL0 to WL5. For example, the lowermost conductive layer 34 which functions as the word line WL0 is adjacent to the uppermost conductive layer 33, with the insulating layer 41 interposed therebetween, as viewed in the Z direction.

An insulating layer 43 is provided on the uppermost conductive layer 34. Six conductive layers 35 and five insulating layers 44 are stacked in an alternating manner on the insulating layer 43. The conductive layers 35 are formed, for example, in a plate shape extending along the XY plane. The stacked conductive layers 35 respectively function as, in order from the side of the p-type well region 30, namely, in order from the lowermost layer, word lines WL6 to WL11. For example, of the conductive layers 35, the lowermost conductive layer 35 which functions as the word line WL6 is arranged at a position closest to the conductive layers 34, as viewed in the Z direction.

An insulating layer 45 is provided on top of the uppermost conductive layer 35. Three conductive layers 36 and two insulating layers 46 are stacked in an alternating manner on top of the insulating layer 45. The conductive layers 36 are formed, for example, in a plate shape extending along the XY plane. The conductive layers 36 function as select gate lines SGD. The uppermost conductive layer 35, which functions as the word line WL11, is adjacent to the lowermost conductive layer 36, with the insulating layer 45 interposed therebetween, as viewed in the Z direction. The number of conductive layers 36 may be designed to be any number. At least one conductive layer 36 should be provided.

An insulating layer 47 is provided on the uppermost conductive layer 36. A plurality of conductive layers 37 are provided on top of the insulating layer 47. The conductive layers 37 are formed in, for example, a linear shape extending in the Y direction, and function as bit lines BL. The conductive layers 37 are aligned along the X direction in an unillustrated region.

The conductive layers 33-37 are configured of a conductive material. The conductive layers 33-36 contain, for example, tungsten (W). The conductive layers 37 contain, for example, copper (Cu). The insulating layers 32 and 40-47 are formed using, for example, a silicon oxide ($SiO_2$).

A plurality of memory pillars MP are provided so as to extend along the Z direction and to penetrate (pass through) the conductive layers 33-36. Each memory pillar MP corresponds to, for example, a NAND string NS.

Each memory pillar MP includes a lower memory pillar LMP and an upper memory pillar UMP that is provided on the lower memory pillar LMP. The lower memory pillar LMP is formed in a hole LMH that is in contact with, at its bottom surface, the p-type well region 30 and penetrates the conductive layers 33 and 34. The upper memory pillar UMP is formed in a hole UMH that penetrates the conductive layers 35 and 36. A boundary portion between the lower memory pillar LMP and the upper memory pillar UMP is also referred to as a joint portion JT. The lower memory pillar LMP and the upper memory pillar UMP have, for example, a tapered shape. Accordingly, the memory pillar MP at the joint portion JT may have a structure in which an outer diameter at an upper end of the lower memory pillar LMP is greater than an outer diameter at a lower end of the upper memory pillar UMP.

Each memory pillar MP includes a block insulating film 50, a charge storage layer 51, a tunnel insulating film 52, a semiconductor layer 53, a core layer 54, and a capping layer 55. The block insulating film 50, the charge storage layer 51, the tunnel insulating film 52, the semiconductor layer 53, and the core layer 54 are continuously provided between the lower memory pillar LMP and the upper memory pillar UMP.

More specifically, a block insulating film 50, a charge storage layer 51, and a tunnel insulating film 52 are sequentially stacked on side surfaces of the holes LMH and UMH. A semiconductor layer 53 is formed in such a manner that its side surface is in contact with the tunnel insulating film 52 and its bottom surface is in contact with the p-type well region 30. The semiconductor layer 53 is a region in which channels of the memory cell transistors MC and the select transistors ST1 and ST2 are to be formed. Accordingly, the semiconductor layer 53 functions as a signal line that couples current paths of the select transistor ST2, the memory cell transistors MC0 to MC11, and the select transistor ST1. A core layer 54 is provided in the semiconductor layer 53. A capping layer 55 is formed on top of the semiconductor layer 53 and the core layer 54, in such a manner that its side surface is in contact with the tunnel insulating film 52.

The block insulating film 50, the tunnel insulating film 52, and the core layer 54 are formed using, for example, $SiO_2$. The charge storage layer 51 is formed using, for example, silicon nitride (SiN). The semiconductor layer 53 and the capping layer 55 may be formed using, for example, polysilicon.

In the above-described structure of the memory pillar MP, a portion at which the lower memory pillar LMP and the conductive layer 33 intersect each other functions as a select transistor ST2. Portions at which the lower memory pillar LMP and the conductive layers 34 intersect function as memory cell transistors MC0 to MC5. Portions at which the upper memory pillar UMP and the conductive layers 35 intersect function as memory cell transistors MCG to MC11. A portion at which the upper memory pillar UMP and the conductive layer 36 intersect function as a select transistor ST1.

A pillar-shaped contact plug CV is provided on top of the capping layer 55 in the memory pillar MP. A top surface of the contact plug CV is in contact with one of the conductive layers 37, namely, one of the bit lines BL. The contact plug CV contains, for example, tungsten.

A slit SLT extending in the X direction is provided, for example, so as to separate the conductive layers 33 to 36 of each block as viewed in the Y direction.

For example, a slit SLT extending in the X direction is provided so as to separate the insulating layer 32, the conductive layers 33 to 36, and the insulating layers 40 to 46 as viewed in the Y direction. An upper end of the slit SLT is included in a layer between the uppermost conductive layer 36 and the conductive layer 37. A lower end of the slit SLT is in contact with the $n^+$-type diffusion layer region 31 in the p-type well region 30. The slit SLT includes, for example, a contact LI and a spacer SP.

The contact LI is formed in a plate shape that extends, at least partially, along the XZ plane. A bottom portion of the contact LI is electrically coupled to the $n^+$-type diffusion layer region 31. The contact LI is used as the source line SL. The contact LI is configured of a conductive material, and may be either a semiconductor or a metal. The spacer SP covers a side surface of the contact LI. The contact LI is distanced from the conductive layers 33-36 and the insulating layers 40-46 by the spacer SP. That is, insulation is provided by the spacer SP between the contact LI and the conductive layers adjacent to the slit SLT. The spacer SP is formed using an insulator such as $SiO_2$ and SiN.

1.2 Threshold Voltage Distributions of Memory Cell Transistors

Figure 5:
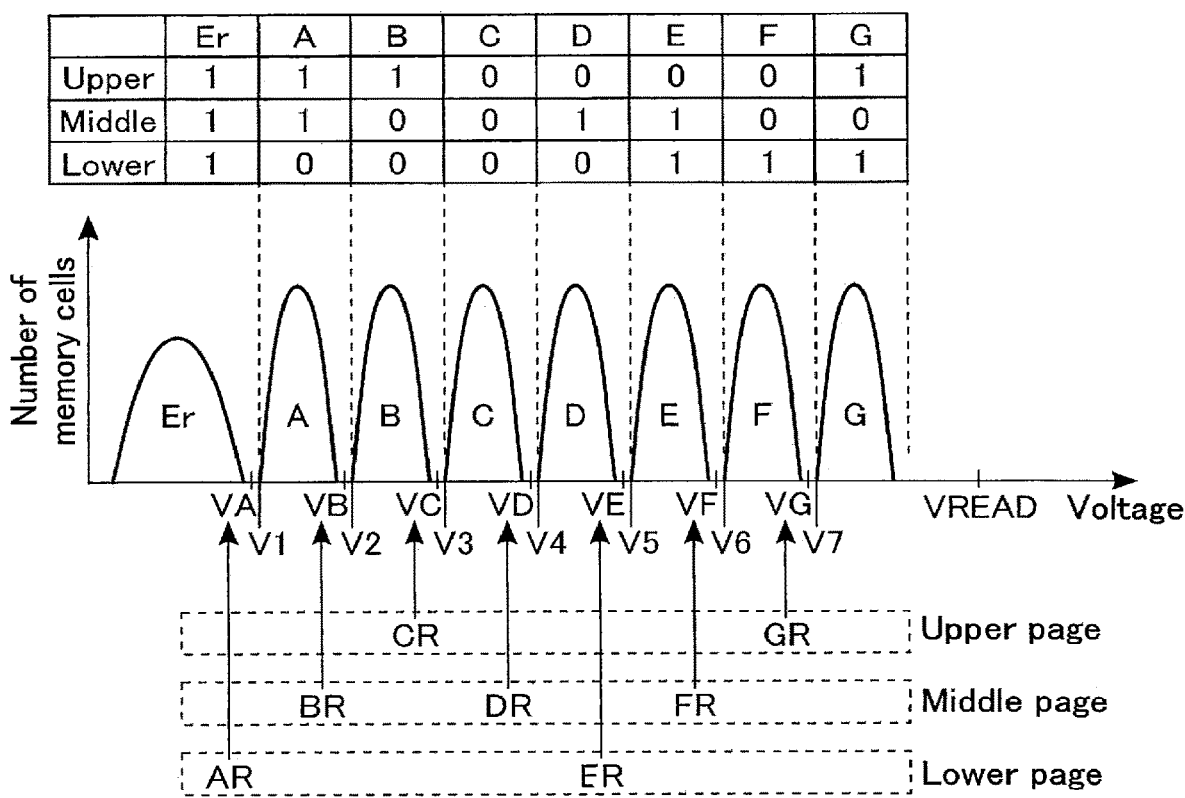
FIG. 5 is a threshold voltage distribution diagram of memory cell transistors in a memory chip included in the memory system according to the first embodiment.

Next, threshold voltage distributions that may be observed in memory cell transistors MC according to the present embodiment will be described with reference to FIG. 5. FIG. 5 is a diagram showing a relationship between threshold voltage distributions of memory cell transistors MC and data allocation. In the present embodiment, a case will be described where each memory cell transistor MC is capable of storing eight values (i.e., three bits) of data; however, the storage capacity of data is not limited to three bits. In the present embodiment, it is only required that each memory cell transistor MC be capable of storing one or more bits of data.

The threshold voltage of each memory cell transistor MC takes a value that falls within, for example, one of eight discrete distributions. The eight distributions will be respectively referred to as, in ascending order of threshold voltage, an "Er" state, an "A" state, a "B" state, a "C" state, a "D" state, an "E" state, an "F" state, and a "G" state.

The "Er" state corresponds to, for example, a data erase state. The "A" to "G" states correspond to states in which charge is injected into the charge storage layer and data is written. Let us assume that, in a write operation, verify voltages corresponding to the respective threshold voltage distributions are V1 to V7. In this case, the values of these voltages satisfy the relation of V1<V2<V3<V4<V5<V6<V7<VREAD. The voltage VREAD is a voltage that is applied to a non-selected word line during a read operation. The memory cell transistor MC is switched to the on state upon application of the voltage VREAD to its gate, regardless of data stored therein.

More specifically, a threshold voltage that falls within the "Er" state is less than the voltage V1. A threshold voltage that falls within the "A" state is equal to or higher than the voltage V1, and less than the voltage V2. A threshold voltage that falls within the "B" state is equal to or higher than the voltage V2, and less than the voltage V3. A threshold voltage that falls within the "C" state is equal to or higher than the voltage V3, and less than the voltage V4. A threshold voltage that falls within the "D" state is equal to or higher than the voltage V4, and less than the voltage V5. A threshold voltage that falls within the "E" state is equal to or higher than the voltage V5, and less than the voltage V6. A threshold voltage that falls within the "F" state is equal to or higher than the voltage V6, and less than the voltage V7. A threshold voltage that falls within the "G" state is equal to or higher than the voltage V7, and less than the voltage VREAD.

A read voltage is set, for example, between neighboring threshold voltage distributions. Read voltages corresponding to "A" state to "G" state read operations will be respectively referred to as VA to VG. In this case, these voltages satisfy the relation of VA<VB<VC<VD<VE<VF<VG<VREAD.

More specifically, a read voltage VA for determining whether a memory cell transistor MC has the "Er" state threshold voltage or whether the memory cell transistor MC has the "A" state or higher-state threshold voltage is set between the maximal threshold voltage in the "Er" state and the minimal threshold voltage in the "A" state. A read voltage VB for determining whether a memory cell transistor MC has the "A" state threshold voltage or whether the memory cell transistor MC has the "B" state or higher-state threshold voltage is set between the maximal threshold voltage in the "A" state and the minimal threshold voltage in the "B" state. The other read voltages VC, VD, VE, VF, and VG are set in a manner similar to the read voltages VA and VB.

Hereinafter, "A" state to "G" state read operations will be respectively referred to as read operations AR, BR, CR, DR, ER, FR, and GR. In a read operation AR, it is determined whether or not the threshold voltage of the memory cell transistor MC is less than the voltage VA. In a read operation BR, it is determined whether or not the threshold voltage of the memory cell transistor MC is less than the voltage VB. In a read operation CR, it is determined whether or not the threshold voltage of the memory cell transistor MC is less than the voltage VC. The same applies to the other read operations.

Setting values for the verify voltages and setting values for the read voltages corresponding to the respective states may be either identical to or different from each other. The threshold voltage of a memory cell transistor MC fluctuates according to, for example, a read disturb, data retention, or the presence or absence of a write operation to a memory cell transistor MC that is coupled to a neighboring word line WL. In the present embodiment, to address such fluctuations in threshold voltage that are supposed to occur, a read operation can be performed by shifting the read voltage by a predetermined voltage value.

As described above, each memory cell transistor MC falls within one of the eight threshold voltage distributions, thereby taking one of the eight states. By assigning these states to "000" to "111" in the binary system, each memory cell transistor MC is capable of storing three bits of data. The three bits of data will be respectively referred to as a "lower bit", a "middle bit", and an "upper bit". A set of lower bits that are collectively written into (or read from) a cell unit CU will be referred to as a "lower page", a set of middle bits that are collectively written into (or read from) a cell unit CU will be referred to as a "middle page", and a set of upper bits that are collectively written into (or read from) a cell unit CU will be referred to as an "upper page".

In the example of FIG. 5, data is allocated to the upper bit, the middle bit, and the lower bit of each of the memory cell transistors MC that belong to each of the threshold voltage distributions.

"Er" state: "111" data
"A" state: "110" data
"B" state: "100" data
"C" state: "000" data
"D" state: "010" data
"E" state: "011" data
"F" state: "001" data
"G" state: "101" data When data allocated in the above manner is read, the lower bit is determined by read operations AR and ER. The middle bit is determined by read operations BR, DR, and FR. The upper bit is determined by read operations CR and GR. That is, the values of the lower bit, the middle bit, and the upper bit are determined by two read operations, three read operations, and two read operations, respectively. Hereinafter, such data allocation will be referred to as "2-3-2 coding". The data allocation to the "Er" to "G" states is not limited to the 2-3-2 coding.

1.3 Read Operation

Figure 6:
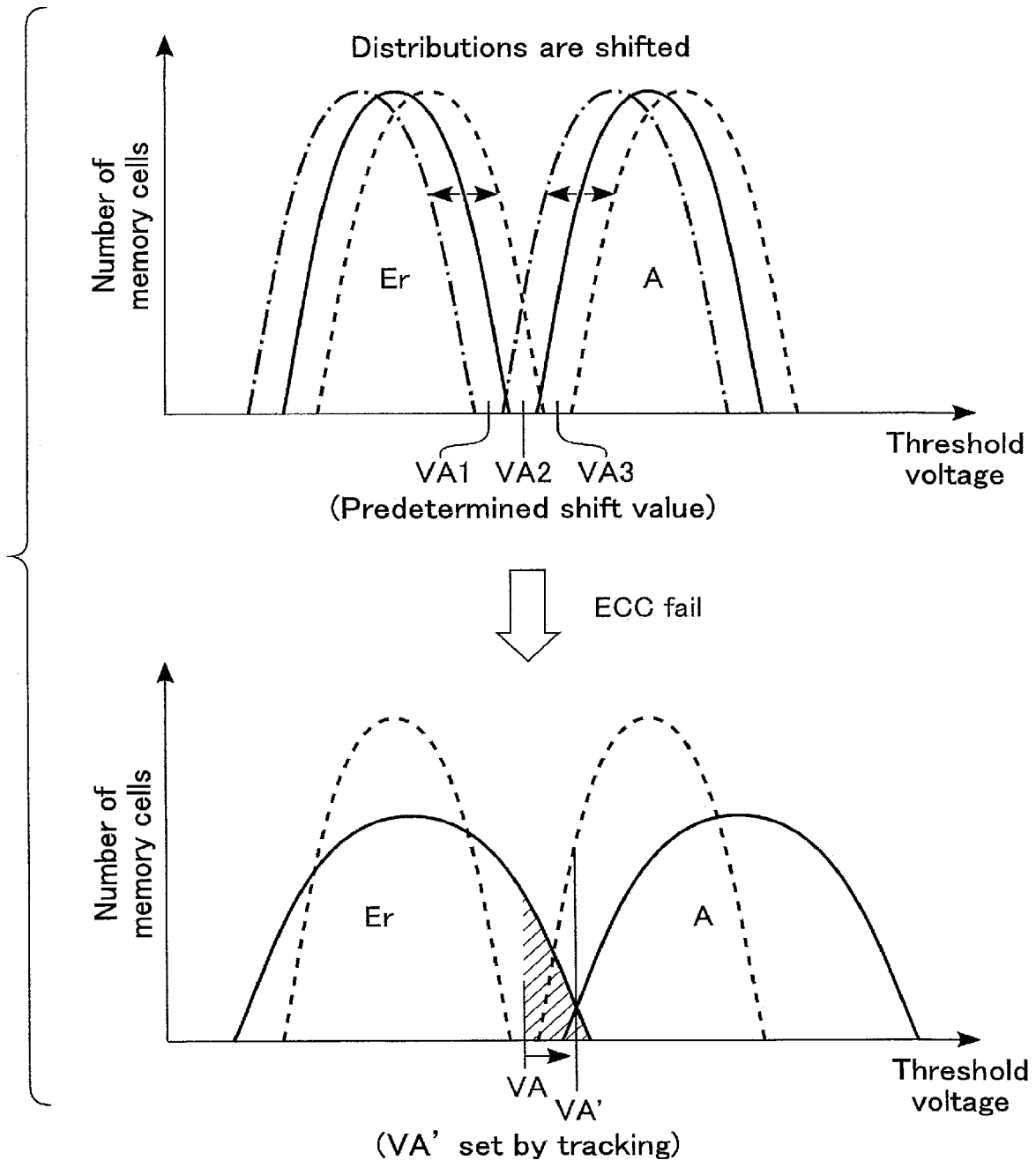
FIG. 6 is a diagram showing a read voltage value in a memory chip included in the memory system according to the first embodiment.

Next, a read operation will be described with reference to FIG. 6. FIG. 6 shows an example of shifting and tracking of a read voltage. In the example of FIG. 6, an "Er" state threshold voltage distribution and an "A" state threshold voltage distribution are shown, to simplify the description.

First, shifting of a read voltage during a read operation will be described.

In the present embodiment, to address shifting of threshold voltage distributions that is supposed to occur, the sequencer 15 can perform a read operation by shifting the read voltage by a predetermined voltage value. In the case of, for example, the threshold voltage distributions shown by the solid line, a read voltage VA2 is set. When the threshold voltage distributions are shifted to the minus side, as shown by the dashed-dotted line, a read voltage VA1 (<VA2) is set. When the threshold voltage distributions are shifted to the plus side, as shown by the dashed line, a read voltage VA3 (>VA2) is set. By shifting the read voltage, the number of failed bits can be reduced at the time of decoding read data in an intra-channel ECC process for decoding in the memory controller 200.

Next, a tracking operation of the read voltage will be described.

Let us assume, for example, that the threshold voltage distributions immediately after data writing are as shown by the dashed lines. There is, however, a case where the widths of the threshold voltage distributions are increased by effects such as data retention after a write operation and a read disturb during a read operation. In such a case, when a read operation is performed at a voltage VA, memory cell transistors MC that fall within the shaded region will be failed bits. If the number of failed bits that have occurred exceed the number of bits that can be error-corrected by the ECC circuit 260, it becomes difficult to correctly read data. If, for example, the number of failed bits increases and the intra-channel ECC process for decoding has failed, the memory chip 100 performs a tracking operation. The tracking operation is an operation of obtaining, when neighboring threshold voltage distributions overlap one another, a location at which a valley is formed between two threshold voltage distributions, namely, an intersection between two threshold voltage distributions, thereby searching for (or calculating) an appropriate read voltage VA', namely, a shift value of a read voltage VA on the basis of the obtained intersection. Alternatively, the tracking operation is an operation of searching for a voltage at which the number of failed bits becomes minimal in an intra-channel ECC process for decoding, or a voltage at which error correction can be performed by an intra-channel ECC process for decoding by varying the read voltage VA.

In the tracking operation, the memory chip 100 performs multiple read operations while shifting the read voltage (hereinafter referred to as a "tracking read operation"). The memory controller 200 may perform, for example, a tracking read operation by an intra-channel ECC process for decoding. In this case, the memory controller 200 calculates a shift value of the read voltage at which the number of failed bits becomes minimal on the basis of the result of the intra-channel ECC process for decoding. Alternatively, the memory chip 100 may count, for example, the number of on-cells at each read voltage of the tracking read operation (number of memory cell transistors MC that are set to on state). In this case, the memory controller 200 calculates a shift value of a read voltage based on the result of the number of on-cells. Hereinafter, a case will be described where the memory controller 200 calculates a shift value of the read voltage on the basis of the result of an intra-channel ECC process for decoding.

1.4 Write Operation

Next, a write operation will be described below. A write operation roughly consists of a program operation and a program verify operation. By repeating the combination of the program operation and the program verify operation (hereinafter referred to as a "program loop"), the threshold voltage of the memory cell transistor MC is increased to the target level.

A program operation is an operation of increasing the threshold voltage of the memory cell transistor MC by injecting electrons into the charge storage layer (or maintaining the threshold voltage by inhibiting the injection).

A program verify operation is an operation of reading data after the program operation, and determining, in the memory chip 100, whether or not the threshold voltage of the memory cell transistor MC has reached a target level. The data read in the program verify operation is not transmitted to the memory controller 200.

In the present embodiment, when a write operation is performed in a single block BLK, word lines WL0, WL1, WL2, . . . are selected in this order. That is, the lowermost word line WL0 described with reference to FIG. 4 is selected first, and the uppermost word line WL11 is selected last. More specifically, data is sequentially written into the cell units CU of the string units SU0, SU1, SU2, and SU3 that are coupled to the word line WL0. Subsequently, data is sequentially written into the cell units CU of the string units SU0, SU1, SU2, and SU3 that are coupled to the word line WL1. Subsequently, data is sequentially written into the cell units CU of the string units SU0, SU1, SU2, and SU3 that are coupled to the word line WL2. Similarly, a write operation is performed on the word lines WL3 to WL11 in this order. The order of the word lines WL (cell units CU) that are selected in a write operation may be freely designed.

1.5 Read Verity Operation

Next, a read verify operation will be described. In the present embodiment, after a write operation, the memory controller 200 performs a read verify operation to confirm whether or not a physical failure is present in a given memory region in the memory chip 100. More specifically, the memory controller 200 confirms whether a burst failure (physical failure) has occurred in the block BLK to be a write target by reading data of a given word line WL (cell unit CU) into the memory controller 200 (hereinafter referred to as a "read process"), causing the ECC circuit 260 to perform an intra-channel ECC process for decoding. A read process in a read verify operation is similar to that in a normal read operation. Upon determining that a burst failure has occurred, the memory controller 200 performs a refresh operation or a bad blocking process on the basis of a shift value obtained by a tracking operation. A refresh operation is an operation of moving valid data in a target memory region to another memory region. A bad blocking process is a process of invalidating the target memory region to make it unusable.

In the present embodiment, a select word line WL to be a target of a write operation will be referred to as "WLn", using a variable n (where n is an integer equal to or greater than 0). A select word line WL to be a target of a read process during a read verify operation will be referred to as "WLm", using a variable m (where m is a given integer that satisfies m≤n). In the present embodiment, a case will be described where the memory controller 200 performs a read verify operation and a word line WLm that satisfies the relation m=n−2 is selected. That is, a word line WL that is arranged two layers below the word line WL to be a target of a write operation will be a target of a read process in a read verify operation. When, for example, a read verify operation is performed, data is already written into the memory cell transistors MC which are coupled to the word lines WL (m−1) and WL(m+1) that are adjacent to the word line WLm. It is thereby possible to suppress an increase in failed bits caused by fluctuations in threshold voltage according to whether data is written into the neighboring memory cell transistors MC.

More specifically, when, for example, a word line WL whose variable n is equal to or greater than 2 (n≥2) is selected during a write operation, the memory system 1 performs a read verify operation, and selects a word line WLm for a read process. On the other hand, when, for example, a word line WL whose variable n is less than 2 (n<2) is selected during a write operation, namely, when the word line WL0 or WL1 is selected, since the variable m becomes less than 0 (m<0), the memory system 1 does not perform a read verify operation.

The relationship between the variable n and the variable m is not limited to the relation of m=n−2. The relationship between the variable n and the variable m may be, for example, m=n−1 or m=n. When, for example, the relationship m=n−1 is satisfied, the memory system 1 does not perform a read verify operation in the selected step when the variable n is less than 1, namely, when the word line WL0 is selected as a target for writing. In the present embodiment, it is only required that data is already written in (stored in) the memory cell transistor MC that is coupled to the word line WLm before a write operation is performed to a memory cell transistor MC corresponding to the word line WLn.

1.5.1 Overall Flow of Read Verify Operation

Figure 7:
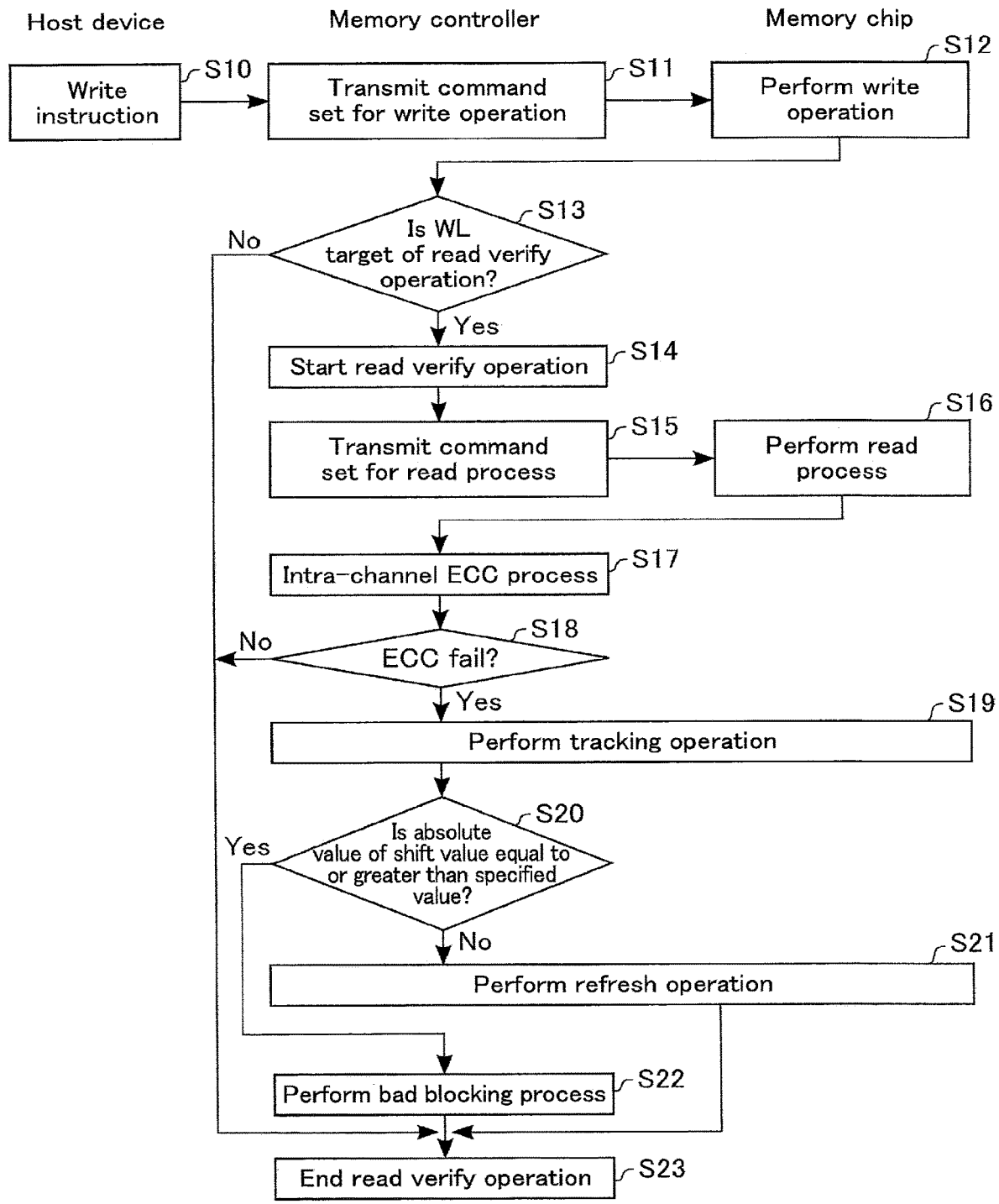
FIG. 7 is a flowchart showing a write operation and a read verify operation in the memory system according to the first embodiment.

First, an overall flow of a read verify operation will be described with reference to FIG. 7. FIG. 7 is a flowchart showing an overall flow of a read verify operation. A read verify operation in the present embodiment includes a read process, an intra-channel ECC process for decoding, a tracking operation, a refresh operation, and a bad blocking process.

A host device transmits a write instruction (including a logical address and write data) to the memory system 1 (S10).

Upon receiving the write instruction from the host device, the memory controller 200 selects a word line WLn to be a write target. More specifically, for example, in the case of inter-channel RAID, the ECC circuit 260 attaches inter-channel parity to user data received from the host device, and generates an inter-channel ECC frame as an encoding process. Also, the ECC circuit 260 generates, as an encoding process, a plurality of intra-channel ECC frames by attaching intra-channel parity to each of the segments of the inter-channel ECC frame. The CPU 230 allocates a physical address (a block BLK, a word line WL, and a string unit SU) of one of the memory chips 100 of one of the channels CH to each intra-channel ECC frame. Subsequently, the memory controller 200 transmits a command set for a write operation to the memory chip 100 of which the physical address is allocated (S11). The command set for a write operation includes a write command, an address, and an intra-channel ECC frame (write data). In the case of inter-channel RAID, the memory controller 200 transmits a command set for a write operation to a plurality of memory chips 100 via a plurality of channels CH of the NAND interface circuit 250.

Upon receiving the command set for a write operation, the memory chip 100 performs a write operation (S12).

After the completion of the write operation, if the word line WLn satisfies a read verify operation implementation condition (S13_Yes), the memory controller 200 starts a read verify operation (S14). On the other hand, if the selected word line WLn does not satisfy the read verify operation implementation condition (S13_No), the memory controller 200 does not perform a read verify operation. More specifically, the memory controller 200 determines that the read verify operation implementation condition is satisfied if and that the read verify operation implementation condition is not satisfied if n<2.

Upon starting the read verify operation, the memory controller 200 selects a word line WLm, and transmits a command set for a read process to the memory chip 100 (S15). The command set for a read process includes a read command and an address, similarly to the usual read operation.

Upon receiving the command set for a read process, the memory chip 100 performs a read process (S16). The read data is transmitted to the memory controller 200.

Upon receiving the read data, the memory controller 200 performs, in the ECC circuit 260, an intra-channel ECC process for decoding of the read data (S17). If the intra-channel ECC process for decoding has failed (S18_Yes), namely, if the number of failed bits exceeds a predetermined number, the memory controller 200 performs a tracking operation in cooperation with the memory chip 100 (S19). More specifically, the memory controller 200 causes the memory chip 100 to perform a tracking read operation. The memory chip 100 transmits data read in the tracking read operation to the memory controller 200. The memory controller 200 performs an intra-channel ECC process for decoding of the received read data, and counts the number of failed bits. Based on the result of the counting, the memory controller 200 determines a shift value of the read voltage. The memory chip 100 may change the read voltage in the word line WL based on the shift value.

On the other hand, if the intra-channel ECC process for decoding does not fail (S18_No), the memory controller 200 completes the read verify operation (S23).

If an absolute value of the shift value of the read voltage is not equal to or greater than a predetermined specified value (S20_No), the memory controller 200 takes the initiative to perform a refresh operation (S21). In the refresh operation, the memory controller 200 controls the memory chip 100, and writes valid data in a block BLK corresponding to the word lines WLn and WLm (i.e., to be a target of a refresh operation) to another block BLK. More specifically, the memory controller 200 transmits a command set for a read operation to the memory chip 100. The memory chip 100 reads valid data from a block BLK to be a target of a refresh operation. There is a case where data in the block BLK to be a target of a refresh operation cannot be normally read, due to a failure of the intra-channel ECC process for decoding. In such a case, data may be read by recovering the missing data by, for example, rescue using inter-channel RAID. When the block BLK to be a target of a refresh operation is a block BLK to be a write target in compaction, the valid data may be read from the block BLK that is the source of the compaction. A compaction is an operation of collecting a plurality of items of valid data of a target block BLK, and moving them to another block BLK. The memory controller 200 may acquire write data by storing the write data in the buffer memory 240 until the completion of a read verify operation, and reading, from the buffer memory 240, data that has failed in the intra-channel ECC process for decoding from the buffer memory 240, thereby performing a refresh operation. Next, the memory controller 200 transmits a command set for a write operation to the memory chip 100. The memory chip 100 writes valid data to another block BLK. Ina block BLK in which a refresh operation has been performed, a write operation in which the subsequent word line WL (i.e., word line WL(n+1), . . . ) is selected is not performed. The block BLK is handled as a block BLK to be an erase target. After the refresh operation has been completed, the memory controller 200 completes a read verify operation (S23).

On the other hand, if the absolute value of the shift value of the read voltage is equal to or greater than a predetermined specified value (S20_Yes), the memory controller 200 performs a bad blocking process of a block BLK corresponding to the word lines WLn and WLm (S22). More specifically, the memory controller 200 writes valid data in a block BLK to be a target of a bad blocking process, and then invalidates the block BLK to make it unusable. After the bad blocking process has been completed, the memory controller 200 completes the read verify operation (S23).

1.5.2 Flow of Read Verify Operation in Single Block

Figure 8:
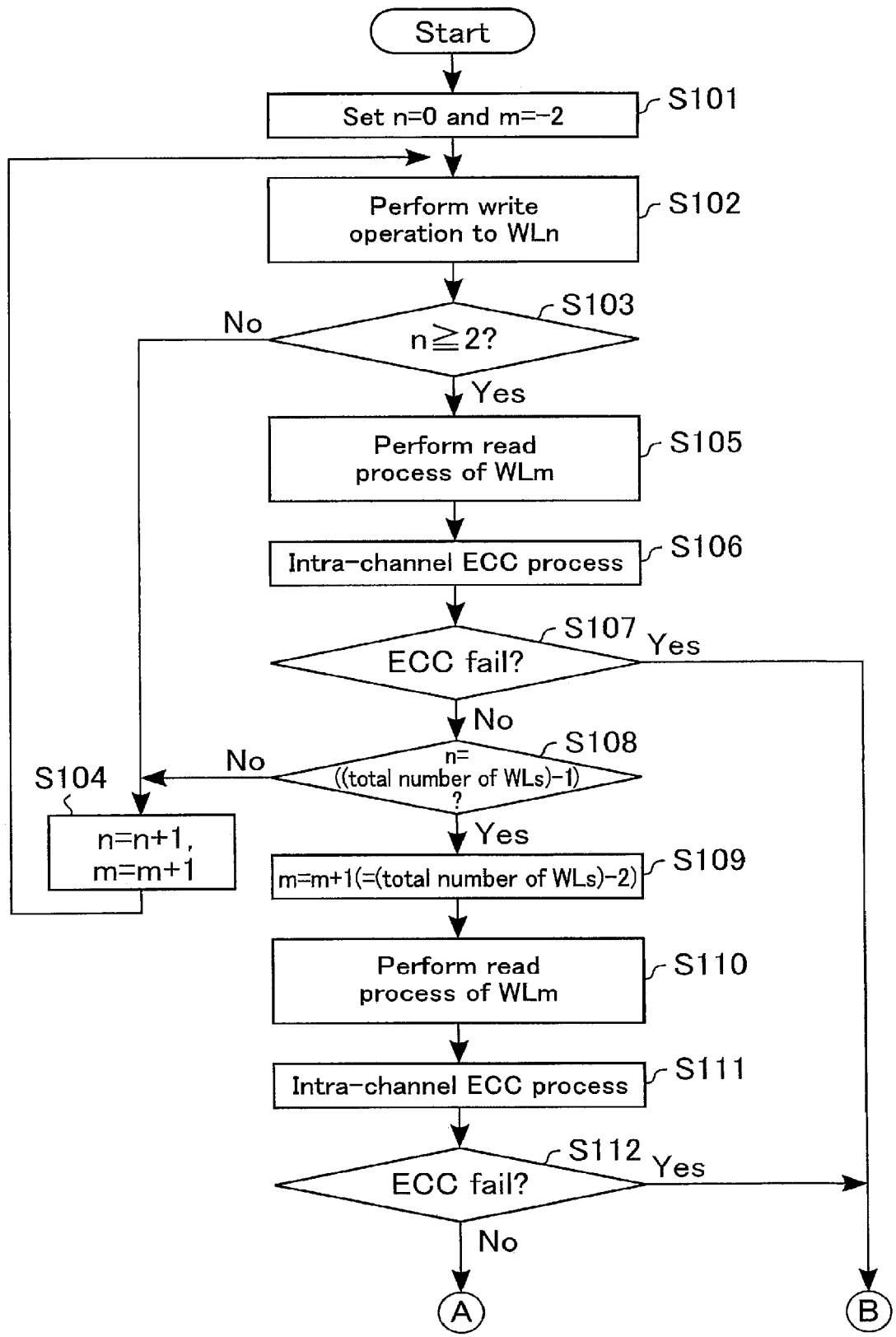
FIGS. 8 and 9 are flowcharts showing a write operation and a read verify operation in a memory chip included in the memory system according to the first embodiment.
Figure 9:
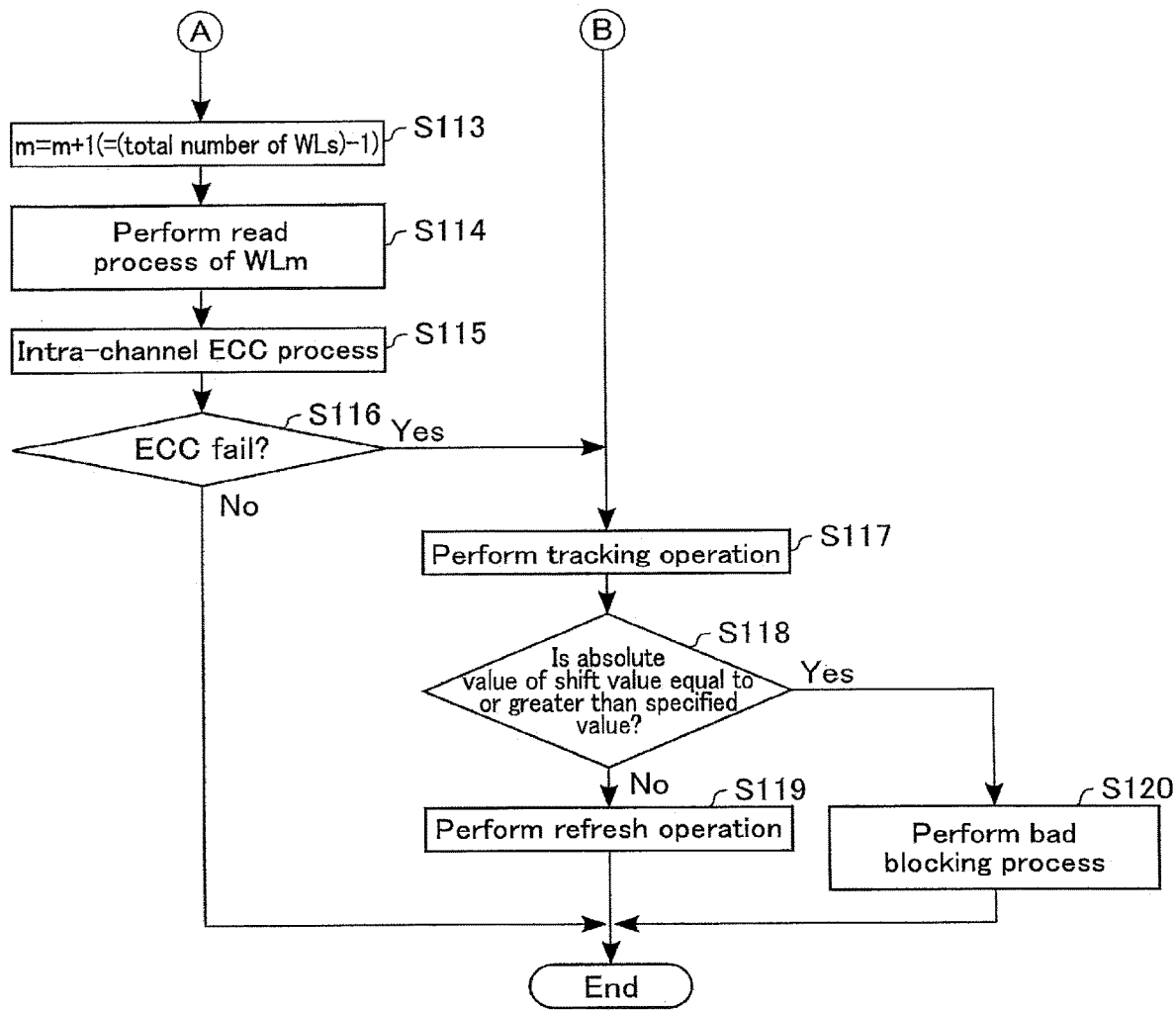

Next, a flow of a read verify operation will be described with reference to FIGS. 8 and 9, with a focus on a single block BLK. FIGS. 8 and 9 are flowcharts showing a flow of a read verify operation in a single block BLK. In the description that follows, a description of the string unit SU will be omitted, to simplify the description.

First, the CPU 230 of the memory controller 200 sets n=0 and m=−2 (S101). Next, the CPU 230 transmits a command set for a write operation corresponding to the word line WLn to the memory chip 100.

Upon receiving the command set for a write operation, the sequencer 15 of the memory chip 100 performs a write operation corresponding to the word line WLn (S102).

If n≥2 is not satisfied (S103_No), namely, if the word line WLn to be a target of a write operation is the word line WL0 or WL1, the CPU 230 increments the variables n and m to satisfy n=n+1 and m=m+1 after the completion of the write operation (S104). Returning to S102, the CPU 230 transmits a command set for a write operation corresponding to the word line WLn to the memory chip 100. The sequencer 15 performs a write operation corresponding to the word line WLn.

If n≥2 (S104_Yes) is satisfied, the CPU 230 starts a read verify operation corresponding to the word line WLm after the completion of the write operation, and transmits a command set for a read process corresponding to the word line WLm to the memory chip 100.

Upon receiving the command set for a read process corresponding to the word line WLm, the sequencer 15 performs a read process corresponding to the word line WLm (S105). The read data is transmitted to the memory controller 200. Subsequently, in the ECC circuit 260, an intra-channel ECC process for decoding of the read data is performed (S106).

If the intra-channel ECC process for decoding has not failed (S107_No), the CPU 230 confirms whether the variable n is equal to "(the total number of the word lines WL)−1" (S108). That is, the CPU 230 confirms, in the block BLK, whether or not the word line WLn is the one that has been selected last. More specifically, the CPU 230 confirms, for example, whether or not the word line WLn is the uppermost word line WL. In the example of FIG. 4, the total number of the word lines WL is 12. Accordingly, if the word line WLn is the uppermost one, the variable n becomes n=12−1=11.

If the variable n is not equal to "(the total number of the word lines WL)−1" (S108_No), namely, if the word line WLn is not the one that has been selected last in the block BLK, the processing advances to step S104, where the CPU 230 increments the variables n and m.

If the variable n is equal to "(the total number of the word lines WL)−1" (S108_Yes), namely, if the word line WLn is the one that has been selected last in the block BLK, the CPU 230 increments the variable m to satisfy m=m+1 (S109). The value of the variable m is equal to "(the total number of the word lines WL)−2". In other words, the word line WLm is the word line WL selected second to the last in the block BLK (the word line WL10 in the example of FIG. 4). At this time, the variable n is not incremented. The CPU 230 transmits a command set for a read process corresponding to the word line WLm to the memory chip 100.

Upon receiving the command set for a read process corresponding to the word line WLm, the sequencer 15 performs a read process corresponding to the word line WLm (S110). The read data is transmitted to the memory controller 200. Subsequently, in the ECC circuit 260, an intra-channel ECC process for decoding of the read data is performed (S111).

If the intra-channel ECC process for decoding has not failed (S112_No), the CPU 230 increments the variable m to satisfy m=m+1 (S113). The value of the variable m is equal to "(the total number of the word lines WL)−1". In other words, the word line WLm is the word line WL (word line WL11 in the example of FIG. 4) selected last in the block BLK. At this time, the variable n is not incremented. The CPU 230 transmits a command set for a read process corresponding to the word line WLm to the memory chip 100.

Upon receiving the command set for a read process corresponding to the word line WLm, the sequencer 15 performs a read process corresponding to the word line WLm (S114). The read data is transmitted to the memory controller 200. Subsequently, in the ECC circuit 260, an intra-channel ECC process for decoding of the read data is performed (S115).

If the intra-channel ECC process for decoding has not failed (S116_No), a write operation and a read verify operation in the block BLK are completed.

If the intra-channel ECC process for decoding has failed at step S107, S112, or S116 (S107_Yes, S112_Yes, or S116_Yes), the memory controller 200 performs a tracking operation in cooperation with the memory chip 100 (S117).

As a result of the tracking operation, if an absolute value of the shift value is not equal to or greater than a specified value (S118_No), the memory controller 200 takes the initiative to perform a refresh operation (S119). On the other hand, if the shift value is equal to or greater than a specified value (S118_Yes), the CPU 230 performs a bad blocking process (S120).

1.5.3 Concrete Example of Shift Value Determination

Next, a concrete example of a shift value determination will be described with reference to FIG. 10. FIG. 10 is a graph showing a relationship between a shift value obtained by a tracking operation and a determination result of shift values in read operations CR and GR corresponding to the upper page.

If at least one of the shift value of the read operation CR and the shift value of the read operation GR exceeds a specified value, a determination condition 1 is satisfied, and it is determined that a bad blocking process is applicable. Alternatively, if neither the shift value of the read operation CR nor the shift value of the read operation GR satisfies the determination condition 1, but the shift value of the read operation CR and the shift value of the read operation GR greatly differ between the plus side and the minus side, a determination condition 2 is satisfied, and it is determined that a bad blocking process is applicable.

1.6 Effects of Present Embodiment

According to the configuration of the present embodiment, it is possible to improve the reliability of the memory system. Details of this effect will be described below.

Burst failures (physical failures) of the memory chip 100 often occur during an erase operation or a write operation; however, there is a case where such burst failures (physical failures) occur during a read operation. In this case, if the number of failed bits is equal to or lower than the number of bits that can be error-corrected by the intra-channel ECC process for decoding, the data can be corrected. However, since much of the correcting capability is consumed for rescue of physical failures, the correcting capability of soft errors (accidental failures) due to a data retention, etc. becomes smaller than expected at the time of design. As the period of time that has passed from a write operation to a read operation increases, the number of accidental failures tends to increase, making it difficult to determine whether or not the failure of the intra-channel ECC process for decoding is a physical failure or an accidental failure.

On the other hand, according to the configuration of the present embodiment, it is possible to perform a read verify operation immediately after a write operation, and to detect a physical failure that has occurred during a read operation. Moreover, by performing a read verify operation immediately after a write operation, a read operation can be performed in a state in which the frequency of occurrence of accidental failures due to a data retention, etc. is low, and a physical failure can be detected with higher precision. It is thereby possible to decrease data read defects due to a physical failure, thus improving the reliability of the memory system.

2. Second Embodiment

Next, a second embodiment will be described. In the second embodiment, a case will be described where the variable n and the variable m are the same, namely, the case where the word line WL to be a write target and the word line WL to be a target of a read verify operation are the same. Hereinafter, the description will focus mainly on matters different from those of the first embodiment.

2.1 Flow of Read Verify Operation in Single Block

Figure 11:
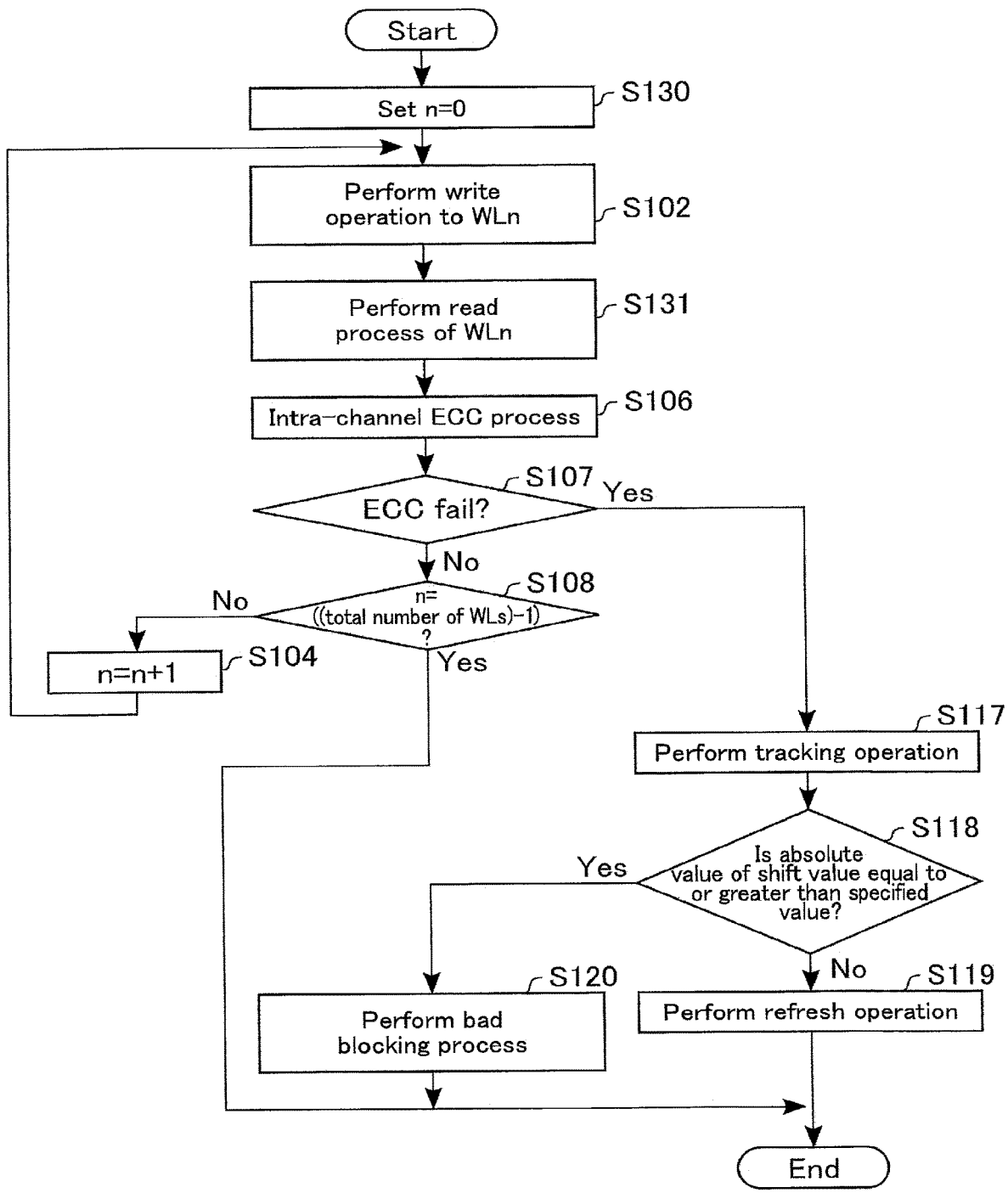
FIG. 11 is a flowchart showing a write operation and a read verify operation in a memory chip included in a memory system according to a second embodiment.

A flow of a read verify operation will be described with reference to FIG. 11, with a focus on a single block BLK. FIG. 11 is a flowchart showing a flow of a read verify operation in a single block BLK. In the present embodiment, a cell unit CU (memory cell transistors MC) corresponding to a select word line WL to be a target of a write operation and a cell unit CU (memory cell transistors MC) corresponding to a select word line WL to be a target of a read process during a read verify operation are the same. The select word line WL in a write operation and a read process will be referred to as WLn, using the variable n (where n is an integer equal to or greater than 0).

First, the CPU 230 of the memory controller 200 sets n=0 (S130). Next, the CPU 230 transmits a command set for a write operation corresponding to the word line WLn to the memory chip 100.

Upon receiving the command set for a write operation, the sequencer 15 of the memory chip 100 performs a write operation corresponding to the word line WLn (S102).

After the completion of the write operation, the CPU 230 starts a read verify operation, and transmits a command set for a read process corresponding to the word line WLn to the memory chip 100.

Upon receiving the command set for a read process, the sequencer 15 performs a read process corresponding to the word line WLn (S131). The read data is transmitted to the memory controller 200. Subsequently, in the ECC circuit 260, an intra-channel ECC process for decoding of the read data is performed (S106).

If the intra-channel ECC process for decoding has not failed (S107_No) the CPU 230 confirms whether the variable n is equal to "(the total number of the word lines WL)−1" (S108). That is, the CPU 230 confirms, in the block BLK, whether or not the word line WLn is the one that has been selected last.

If the variable n is not equal to "(the total number of the word lines WL)−1" (S108_No), namely, if the word line WLn is not the one that has been selected last in the block BLK, the processing advances to step S104, where the CPU 230 increments the variable n, similarly to FIG. 8 of the first embodiment.

If the variable n is equal to "(the total number of the word lines WL)−1" (S108_Yes), namely, if the word line WLn is the one that has been selected last in the block ELK, the CPU 230 completes the read verify operation.

If the intra-channel ECC process for decoding has failed (S107_Yes), a tracking operation is performed (S117). The operation that follows is similar to that of the first embodiment described with reference to FIG. 9.

2.2 Effects of Present Embodiment

According to the configuration of the present embodiment, effects similar to those of the first embodiment are achieved.

In addition, according to the configuration of the present embodiment, a read verify operation can be performed on a select word line WL during a write operation. For example, the memory controller 200 stores write data in the buffer memory 240 until the completion of a read verify operation. If the word line WL to be a target of a write operation and a word line WL to be a target of a read verify operation are different, the buffer memory 240 stores write data corresponding to a plurality of word lines WL on which a write operation has been performed but a read verify operation has not been performed. On the other hand, if the word line WL to be a target of a write operation and the word line WL to be a target of a read verify operation are the same, it is only required for the buffer memory 240 to store write data corresponding to a single word line. WL. Thus, according to the configuration of the present embodiment, it is possible to reduce the memory capacity of the buffer memory 240 which stores write data.

3. Third Embodiment

Next, a third embodiment will be described. In the third embodiment, two examples will be described with respect to the case where, in a memory chip 100, part of the memory region is selected to perform a read verify operation. Hereinafter, the description will focus mainly on matters different from those of the first and second embodiments.

3.1 First Example

In the first example, a case will be described where a block BLK to be subjected to a read verify operation is selected. In the present example, a case will be described where a block ELK to be subjected to a read verify operation is selected in a memory chip 100 in which the coding rate of inter-channel parity differs according to the block BLK.

Figure 12:
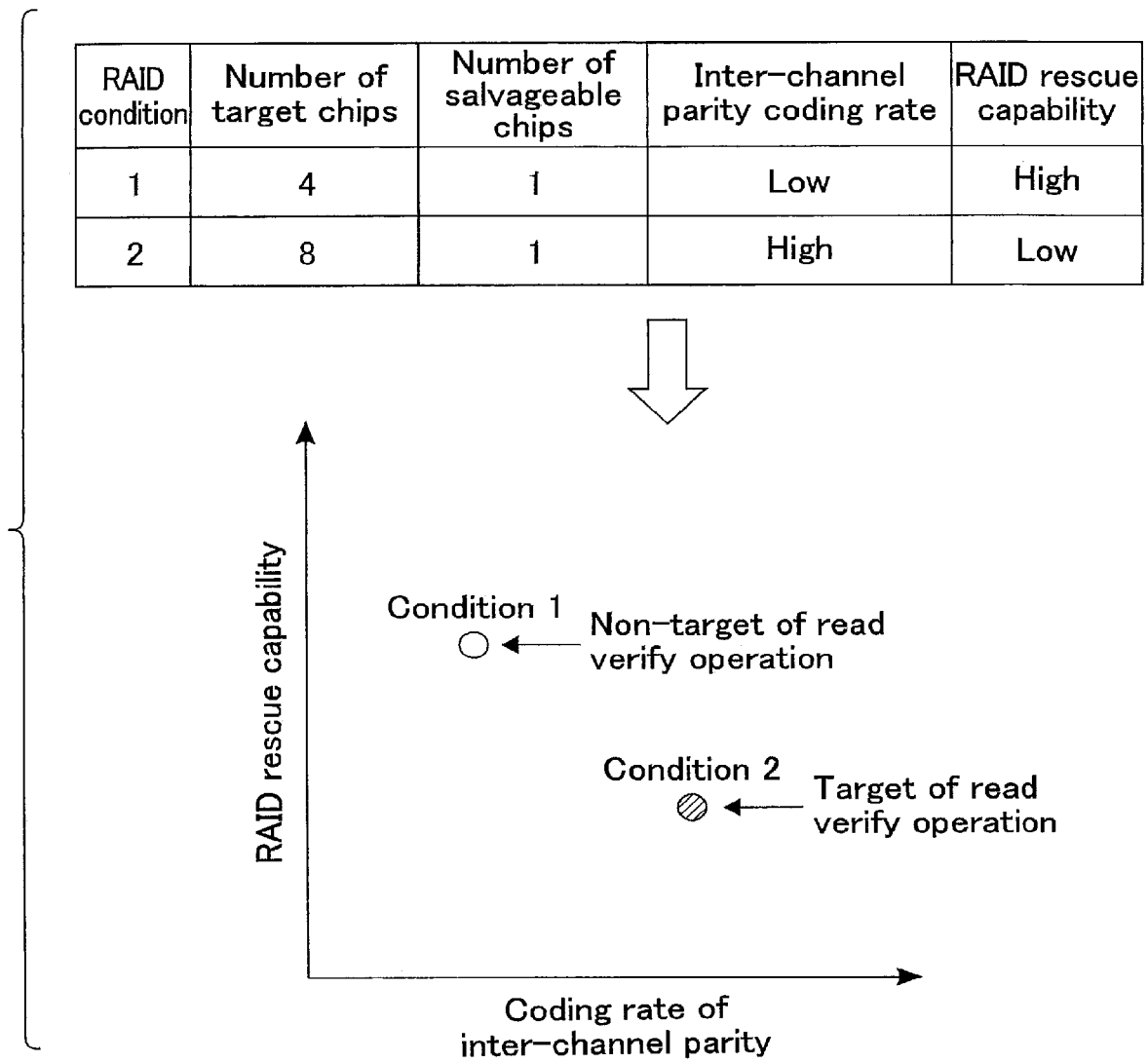
FIG. 12 is a diagram showing a relationship between a coding rate of inter-channel parity and a RAID rescue capability.

3.1.1 Relationship Between Coding Rate of Inter-Channel Parity and Rescue Capability An example of a relationship between the coding rate of the inter-channel parity and the rescue capability will be described with reference to FIG. 12. FIG. 12 shows a relationship between the coding rate of inter-channel parity and the rescue capability in inter-channel RAID with respect to two different inter-channel RAID application conditions (hereinafter referred to as "RAID conditions").

The memory controller 200 generates, for example, a single inter-channel ECC frame for one or more items of user data. The memory controller 200 writes the generated inter-channel ECC frame into four memory chips 100 in a distributed manner. At this time, a case where inter-channel parity is attached to each of the segments of the inter-channel ECC frame in such a manner that, even if the read data from a single memory chip 100 is missing, the user data can be salvaged by rescue (inter-channel ECC process) by inter-channel RAID will be referred to as RAID Condition 1. Also, the memory controller 200 writes a single inter-channel ECC frame into eight memory chips 100 in a distributed manner. At this time, a case where inter-channel parity is attached to each of the segments of the inter-channel ECC frame in such a manner that, even if the read data from a single memory chip 100 is missing, the user data can be salvaged by rescue (inter-channel ECC process) by inter-channel RAID will be referred to as RAID Condition 2.

When the number of memory chips 100 that are salvageable is equal, as in RAID conditions 1 and 2, the coding rate of the inter-channel parity increases as the number of memory chips to be targets of inter-channel RAID increases. Accordingly, the coding rate of the inter-channel parity of RAID Condition 1 is lower than the coding rate of the inter-channel parity of RAID Condition 2. The inter-channel parity is used for rescue of failed bits due to a physical failure. As the number of memory chips to be targets of inter-channel RAID decreases, the probability that a defect (accidental failure) other than a physical failure will be mixed into the failed bits decreases, thus reducing the likelihood of occurrence of a critical defect (a defect that cannot be salvaged by an intra-channel. ECC process). Accordingly, when the rescue capability (hereinafter also referred to as "RAID rescue capability") by the inter-channel ECC process in inter-channel RAID is compared, the rescue capability under RAID Condition 1 is higher than the rescue capability under RAID Condition 2. That is, when the inter-channel RAID is applied, the RAID rescue capability increases as the coding rate of the inter-channel parity decreases. In the present example, for example, a read verify operation is not performed on a memory region to which data is written under RAID Condition 1 and which has a high RAID rescue capability, and a read verify operation is performed on a memory region to which data is written under RAID Condition 2 and which has a low RAID rescue capability.

The number of target chips and the number of salvageable chips under the RAID conditions may be freely designed. Also, the number of the RAID conditions may be equal to or greater than three. In this case, a memory region that has a RAID rescue capability equal to or higher than a predetermined specified value may be set as a non-target of a read verify operation, and a memory region that has a RAID rescue capability less than the specified value may be set as a target of a read verify operation.

3.1.2. Concrete Example of Read Verify Operation

Figure 13:
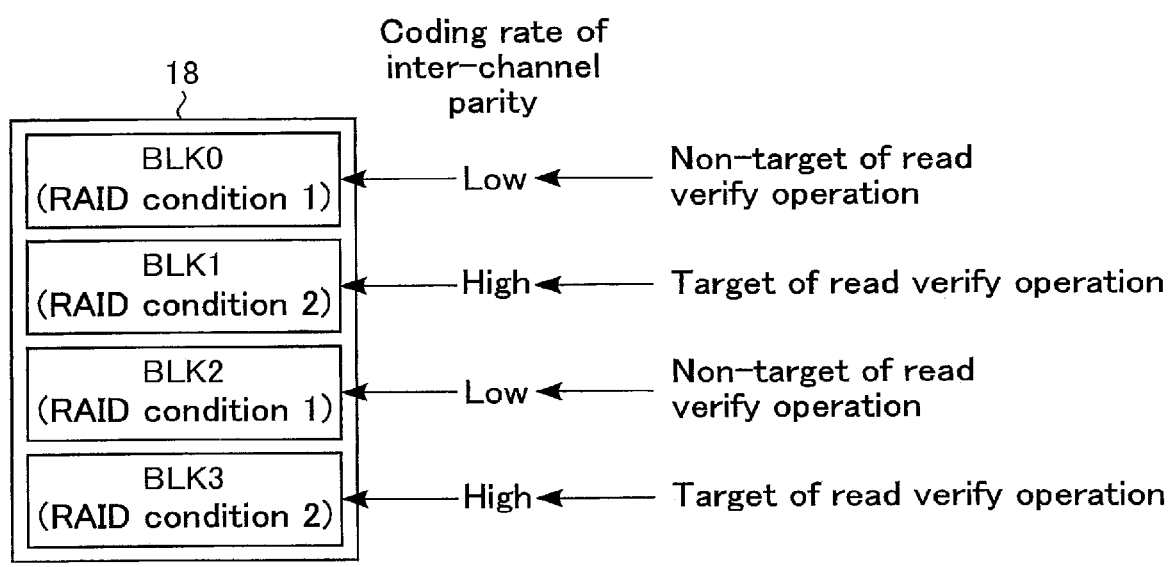
FIG. 13 is a diagram showing an example of a target of a read verify operation in a memory chip included in a memory system according to a first example of a third embodiment.

Next, a concrete example of a target of a read verify operation will be described with reference to FIG. 13. FIG. 13 is a diagram showing a relationship between a block BLK and a target of a read verify operation when different RAID conditions are applied to the blocks.

For example, RAID Condition 1 is applied to the blocks BLK0 and BLK2, and RAID Condition 2 is applied to the blocks BLK1 and BLK3. In this case, as described with reference to FIG. 12, the blocks BLK0 and BLK2 are set as non-targets for a read verify operation, and the blocks BLK1 and BLK3 are set as targets for a read verify operation.

3.1.3 Overall Flow of Read Verify Operation

Figure 14:
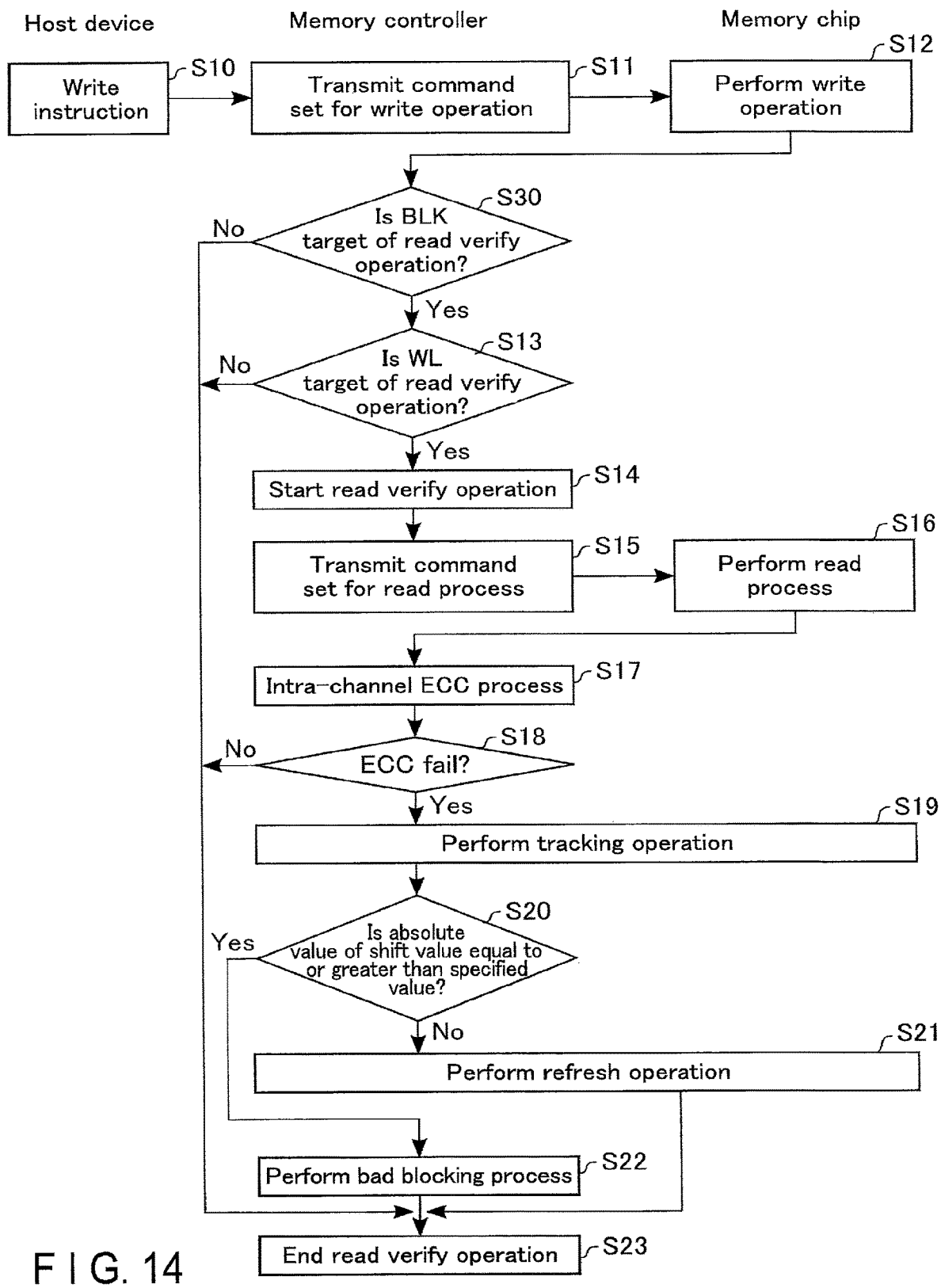
FIG. 14 is a flowchart showing a write operation and a read verify operation in the memory system according to the first example of the third embodiment.

Next, an overall flow of a read verify operation will be described with reference to FIG. 14. FIG. 14 is a flowchart showing an overall flow of a read verify operation. In the present example, unlike the first embodiment described with reference to FIG. 7, after the completion of the write operation (S12), the memory controller 200 confirms whether a block BLK selected in a write operation is a target of a read verify operation (S30). If the selected block BLK is not a target of a read verify operation (S30_No), a read verify operation is not performed.

On the other hand, if the selected block ELK is a target of a read verify operation (S30_Yes), the memory controller 200 performs step S13 and the subsequent steps described in the first embodiment with reference to FIG. 7.

3.2 Second Example

In the second example, a case will be described where a word line WL to be subjected to a read verify operation is selected. In the present example, a case will be described where a read verify operation is performed on a word line WL in which a physical failure is relatively likely to occur, resulting from the structure of the memory cell array.

3.2.1 Concrete Example of Target of Read Verify Operation

Figure 15:
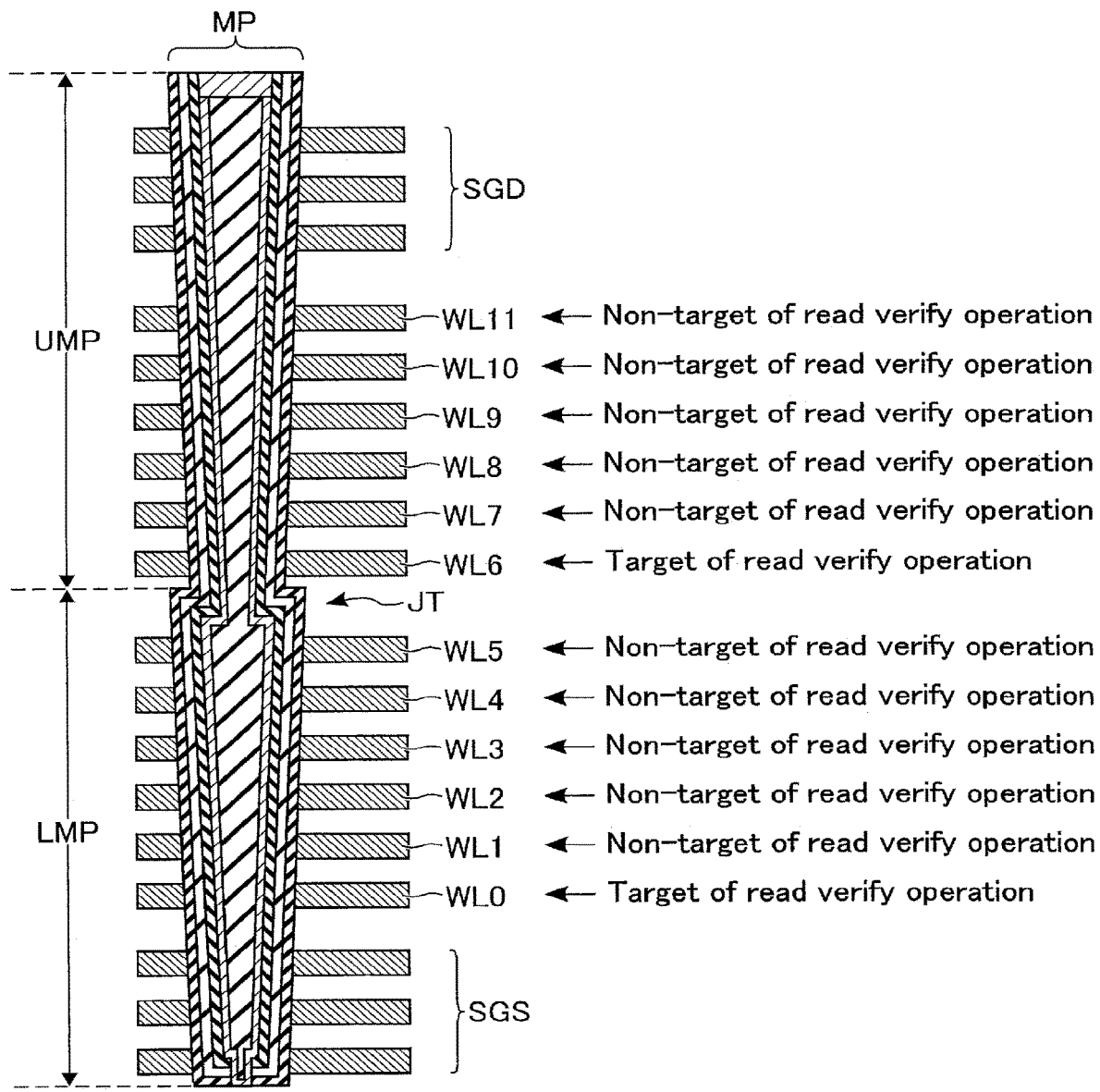
FIG. 15 is a diagram showing an example of a target of a read verify operation in a memory chip included in a memory system according to a second example of the third embodiment.

A concrete example of a target of a read verify operation will be described with reference to FIG. 15. FIG. 15 shows a relationship between the word lines WL and targets of a read verify operation.

The lower memory pillar LMP and the upper memory pillar UMP have, for example, a tapered shape. That is, the outer diameter at the lower end portion of each pillar is smaller than the outer diameter at its upper end portion. For example, the outer diameter at the upper end portion of the lower memory pillar LMP is larger than the outer diameter at the lower end portion of the upper memory pillar UMP. In such a case, processing a hole or burying a material into the pillar is more difficult in the lower region of the pillar, thus increasing the likelihood of occurrence of a physical failure resulting from a manufacturing defect. Also, in the joint portion JT, a physical failure resulting from a manufacturing defect is likely to occur due to unevenness, misalignment, etc. of the lower memory pillar LMP and the upper memory pillar UMP. Accordingly, in the example of FIG. 15, the lowermost word line WL in each pillar in which a physical failure is relatively highly likely to occur, namely, the word lines WL0 and WL6 are set as targets of a read verify operation, and the other word lines WL are set as non-targets of a read verify operation. Selection of a word line WL to be a target of a read verify operation may be designed freely.

3.2.2 Read Verify Operation in Single Block

Figure 16:
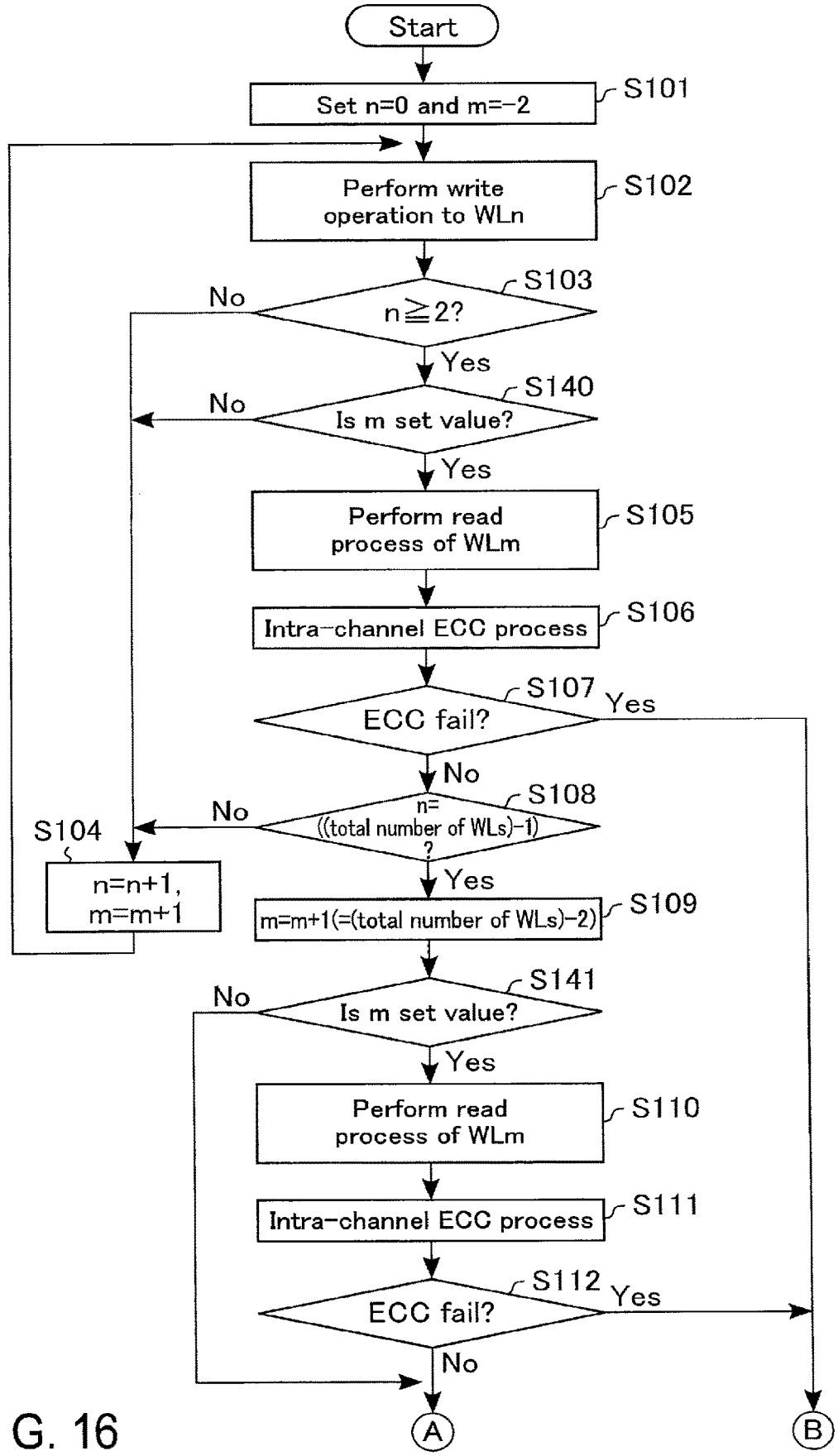

Next, a flow of a read verify operation will be described with reference to FIGS. 16 and 17, with a focus on a single block BLK. FIGS. 16 and 17 are flowcharts showing a flow of a read verify operation in a single block BLK. The present example may be combined with the second embodiment. In the description that follows, a description of the string unit SU will be omitted, to simplify the description.

The processing in steps S101 and S102 is similar to that of the first embodiment described with reference to FIG. 8. Unlike the first embodiment described with reference to FIG. 8, if n≥2 (S103_Yes), the CPU 230 confirms whether the variable m is a set value (e.g., m=0 or m=6) (S140).

If the variable m is not the set value (S140_No), namely, if the word line WLm is not a target of a read verify operation, the CPU 230 increments the variables n and m to satisfy n=n+1 and m=m+1 after the completion of the write operation (S104).

On the other hand, if the variable m is the set value (S140_Yes), namely, if the word line WLm is a target of a read verify operation, the CPU 230 starts a read verify operation after the completion of the write operation, and transmits a command set for a read process corresponding to the word line WLm to the memory chip 100. The operation from step S105 to step S108 is similar to that of the first embodiment described with reference to FIGS. 8 and 9.

If the variable n is equal to "(the total number of the word lines WL)−1" (S108_Yes), the CPU 230 increments the variable m to satisfy m=m+1 (S109). The value of the variable m is equal to "(the total number of the word lines WL)−2". In other words, the word line WLm is the word line WL selected second to the last in the block BLK. At this time, the variable n is not incremented.

The CPU 230 confirms whether the variable m is a set value (e.g., m=0 or m=6) (S141). If the variable m is not the set value (S141_No), namely, if the word line WLm is not a target of a read verify operation, the CPU 230 does not perform a read process corresponding to the word line WLm.

On the other hand, if the variable m is the set value (S141_Yes), namely, if the word line WLm is a target of a read verify operation, the CPU 230 transmits a command set for a read process corresponding to the word line WLm to the memory chip 100.

Upon receiving the command set for a read process corresponding to the word line WLm, the sequencer 15 performs a read process corresponding to the word line WLm (S110). The read data is transmitted to the memory controller 200. Subsequently, in the ECC circuit 260, an intra-channel ECC process for decoding of the read data is performed (S111).

If the intra-channel ECC process for decoding has not failed (S112_No), the CPU 230 increments the variable m to satisfy m=m+1 (S113). The value of the variable m is equal to "(the total number of the word lines WL)−1". In other words, the word line WLm is the word line WL selected last in the block BLK. At this time, the variable n is not incremented.

The CPU 230 confirms whether the variable m is a set value (e.g., m=0 or m=6) (S142"). If the variable m is not a set value (S142_No), namely, if the word line WLm is not a target of a read verify operation, the CPU 230 does not perform a read process corresponding to the word line WLm.

On the other hand, if the variable m is a set value (S142_Yes), namely, if the word line WLm is a target of a read verify operation, the CPU 230 transmits a command set for a read process corresponding to the word line WLm to the memory chip 100.

Upon receiving the command set for a read process corresponding to the word line WLm, the sequencer 15 performs a read process corresponding to the word line WLm (S114). The read data is transmitted to the memory controller 200. Subsequently, in the ECC circuit 260, an intra-channel ECC process for decoding of the read data is performed (S115).

If the intra-channel ECC process for decoding has not failed (S116_No), a write operation and a read verify operation in the block BLK are completed.

If the intra-channel ECC process for decoding has failed at step S107, S112, or S116 (S107_Yes, S112_Yes, or S116_Yes), a tracking operation is performed (S117).

As a result of the tracking operation, if an absolute value of the shift value is not equal to or greater than a specified value (S118_No), the memory controller 200 takes the initiative to perform a refresh operation (S119). On the other hand, if the shift value is equal to or greater than a specified value (S118_Yes), the CPU 230 performs a bad blocking process (S120).

3.3 Third Example

In the third example, a case will be described where a string unit SU to be subjected to a read verify operation is selected, with reference to FIG. 18. FIG. 18 shows a case where, as an example, an odd-numbered string unit SU in a single block BLK is selected as a target of a read verify operation.

As shown in FIG. 18, when, for example, four string units SU0 to SU3 are provided in a single block BLK, odd-numbered string units SU1 and SU3 are set as targets of a read verify operation. Alternatively, even-numbered string units SU0 and SU2 may be set as targets of a read verify operation. Upon occurrence of a physical failure, which may affect the neighboring string units SU, it is possible to detect the physical failure by making either even-numbered or odd-numbered string units SU targets of a read verify operation.

3.4 Fourth Example

Figure 19:
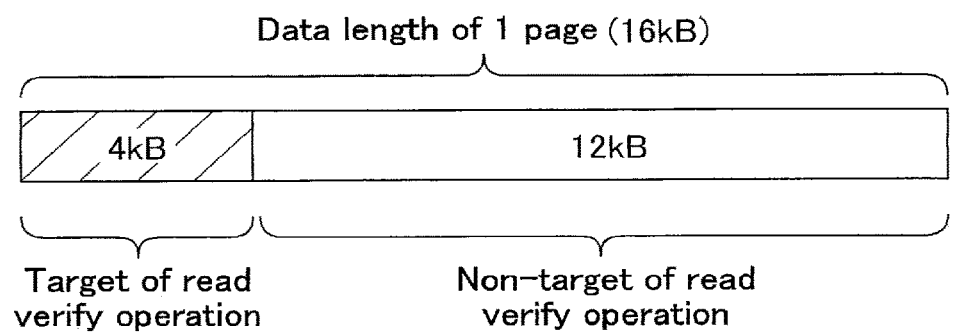
FIG. 19 is a diagram showing an example of a target of a read verify operation in a memory chip included in a memory system according to a fourth example of the third embodiment.

In the fourth example, a case will be described where a portion of data (a memory cell transistor MC) of a data length of 1 page is selected as a target of a read verify operation, with reference to FIG. 19. FIG. 19 shows a case where, as an example, a portion of data of a data length of 1 page is selected as a target of a read verify operation.

When, for example, the data length of 1 page is 16 kB, 4 kB of the data is set as a target of a read verify operation, and the remaining 12 kB is set as a non-target of the read verify operation. The data length of data to be a target of a read verify operation and the memory region to be selected may be freely designed. By selecting (deleting) the data (memory region) to be a target of a read verify operation (target of an intra-channel ECC process for decoding), the time required to transfer data from the memory chip 100 to the memory controller 200 and the time required for the intra-channel ECC process for decoding can be reduced. If a memory region to be a target of a read verify operation is selected, it is preferable that data to be a target of a read verify operation (a target of an intra-channel ECC process for decoding) is selected over a wide area of the page, in such a manner that, even if physical failures are concentrated on a particular memory region, the failures can be detected. In the present example, the entire page is set as a target of a data read process. Of the entire page of data, data to be a target of a read verify operation is transmitted to the memory controller 200.

3.5 Fifth Example

Figure 20:
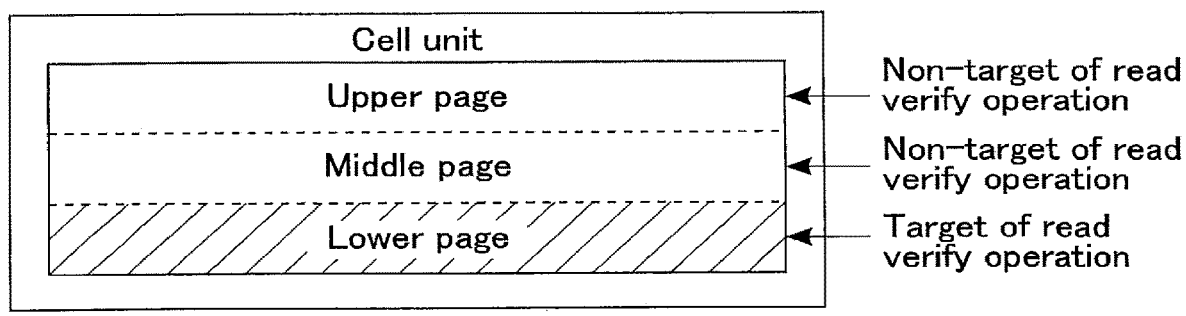
FIG. 20 is a diagram showing an example of a target of a read verify operation in a memory chip included in a memory system according to a fifth example of the third embodiment.

In the fifth example, a case will be described, with reference to FIG. 20, where, when the cell unit CU is capable of storing two or more pages of data, namely, when the memory cell transistor MC is capable of storing data of 2 or more bits, one of the pages is set as a target of a read verify operation. FIG. 20 shows an example in which, in a single cell unit CU, part of the page data is selected as a target of a read verify operation.

When, for example, the cell unit CU is capable of storing three pages of data, as described in the first embodiment with reference to FIG. 5, the lower page is set as a target of a read verify operation, and the middle page and the upper page are set as non-targets of a read verify operation. The page to be a target of a read verify operation may be freely designed. One or more pages may be selected as a target of a read verify operation.

When one of the pages is extracted to perform a read verify operation, the time required to transfer data from the memory chip 100 to the memory controller 200 and the time required for the intra-channel ECC process for decoding can be reduced, compared to when a read verify operation is performed on all the pages.

3.6 Effects of Present Embodiment

According to the configuration of the present embodiment, it is possible to obtain effects similar to those of the first and second embodiments.

Moreover, according to the configuration of the present embodiment, since a read verify operation can be intensively performed on a memory region in which a physical failure is likely to occur relatively highly, the time required to transfer data from the memory chip 100 to the memory controller 200 and the time required for the intra-channel ECC process for decoding can be reduced, thus suppressing a delay in processing time due to a read verify operation. It is thereby possible to suppress a decrease in processing capability of the memory system 1.

4. Fourth Embodiment

Next, a fourth embodiment will be described. In the fourth embodiment, four examples will be described with respect to the case where the criteria for determination of the refresh operation and the bad blocking process are different from those of the first to third embodiments. Hereinafter, the description will focus mainly on matters different from those of the first to third embodiments.

4.1 First Example

A first example will be described. In the first example, the variables n and m satisfy the relation of, for example, m=n−2, similarly to the first embodiment. Whether or not to perform a refresh operation is determined based on a result of a tracking operation (i.e., a shift value). A bad blocking process is performed when multiple refresh operations resulting from read verify operations are performed within a predetermined number of write/erase cycles (hereinafter referred to as a "prescribed number of cycles") in the same block BLK.

In the description that follows, let us assume that a prescribed number of cycles will be referred to as D (where D is an integer equal to or greater than 0), and that the remaining number of cycles from the previous refresh operation until the prescribed number of cycles D is reached is a variable d (d≤D).

4.1.1 Overall Flow of Read Verify Operation

Figure 21:
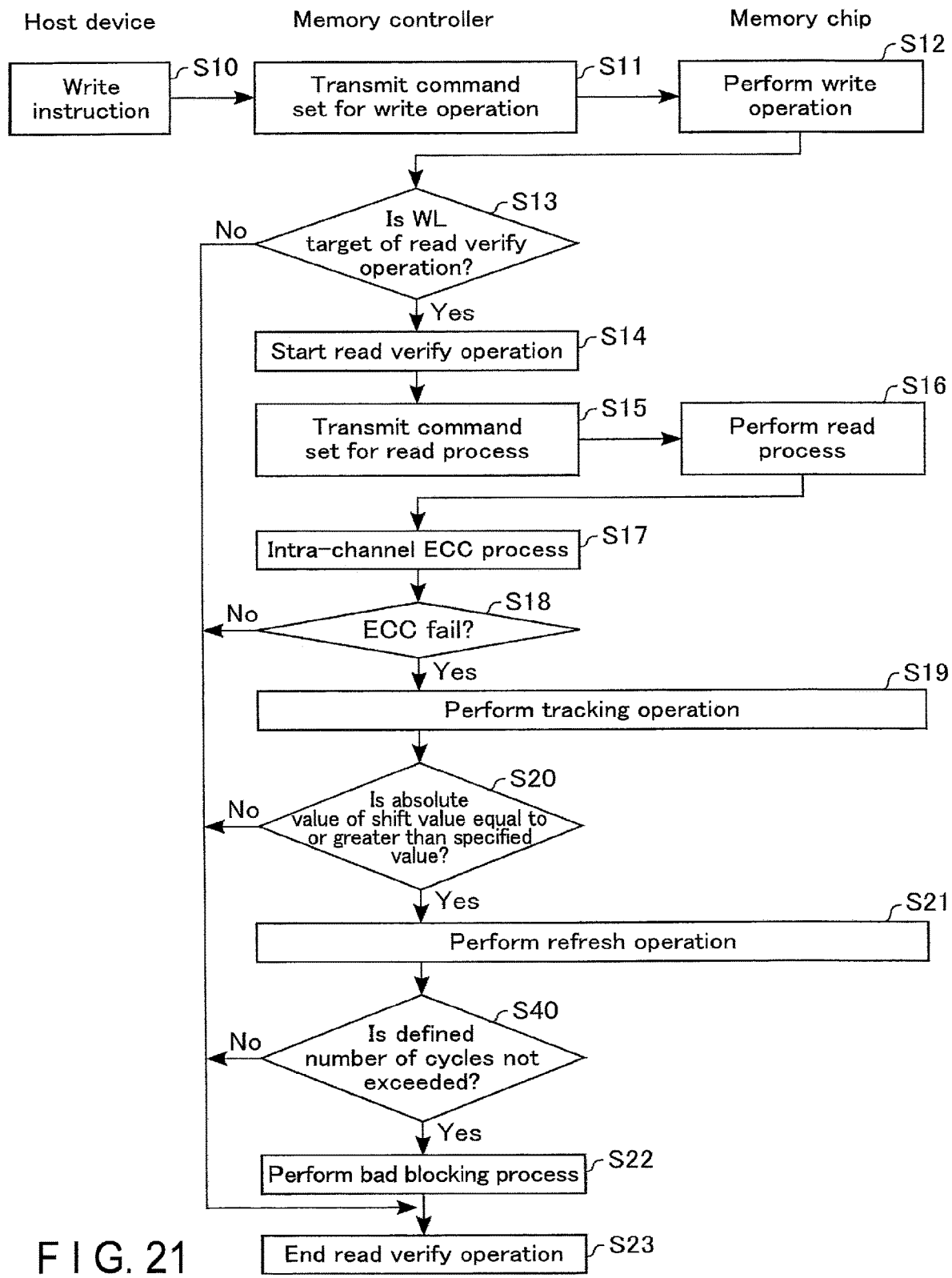
FIG. 21 is a flowchart showing a write operation and a read verify operation in a memory system according to a first example of a fourth embodiment.

First, an overall flow of a read verify operation will be described with reference to FIG. 21. FIG. 21 is a flowchart showing an overall flow of a read verify operation. A read verify operation in the present example includes a read process, an intra-channel ECC process for decoding, a tracking operation, a refresh operation, and a bad blocking process.

The processing from step S10 to step S19 is similar to that in FIG. 7 of the first embodiment.

If an absolute value of the shift value of the read voltage is not equal to or greater than a predetermined specified value (S20_No), the memory controller 200 takes the initiative to complete a read verify operation (S23).

On the other hand, if an absolute value of the shift value of the read voltage is equal to or greater than a predetermined specified value (S20_Yes), the memory controller 200 takes the initiative to perform a refresh operation (S21).

After the performance of the refresh operation, the memory controller 200 confirms whether the refresh operation has been performed within a prescribed number of cycles D since performance of the previous refresh operation (S40).

If a refresh operation has not been performed within the prescribed number of cycles D (S40_No), more specifically, if a refresh operation resulting from a read verify operation has not been performed in the block BLK, or if a prescribed number of cycles D has been reached since performance of the previous refresh operation resulting from a read verify operation, the memory controller 200 completes the read verify operation (S23).

If a refresh operation has been performed within the prescribed number of cycles D (S40_Yes), the memory controller 200 performs a bad blocking process of the block BLK (S22). After the bad blocking process has been completed, the memory controller 200 completes the read verify operation (S23)

4.1.2 Flow of Read Verify Operation in Single Block

Figure 22:
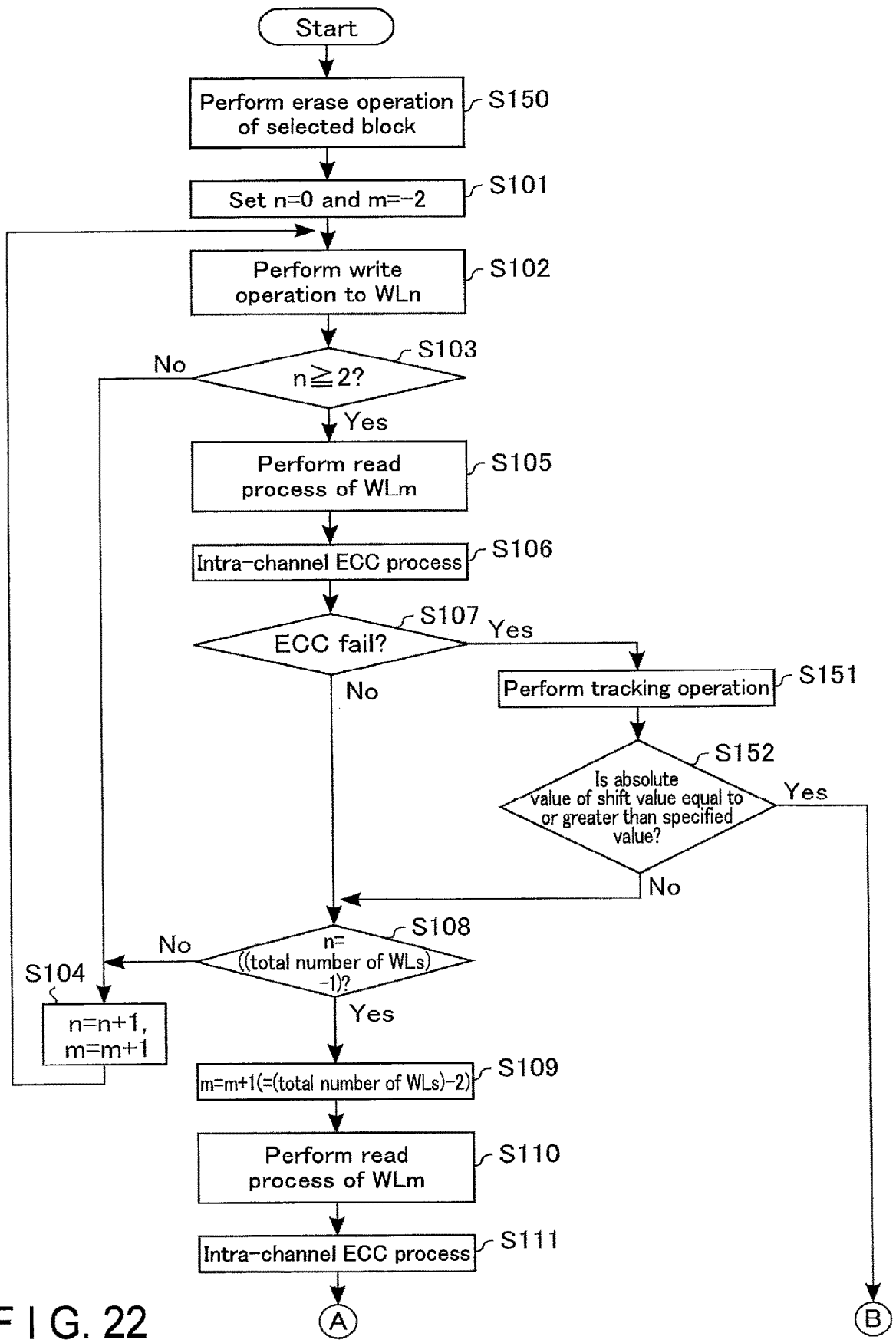
FIGS. 22 and 23 are flowcharts showing a write operation and a read verify operation in a memory chip included in the memory system according to the first example of the fourth embodiment.
Figure 23:
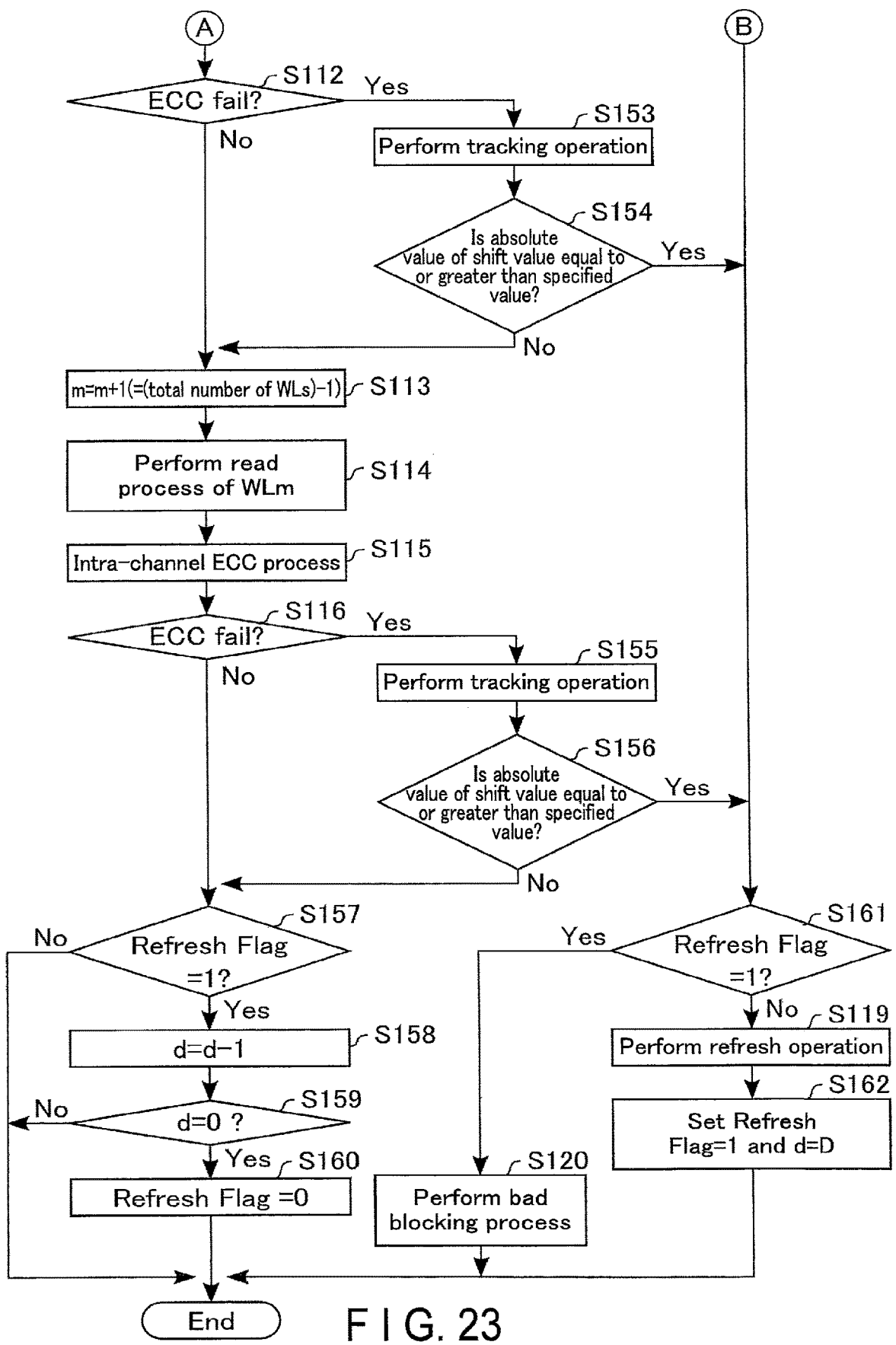

Next, a flow of a read verify operation in a single write/erase cycle will be described with reference to FIGS. 22 and 23, with a focus on a single block BLK. FIGS. 22 and 23 are flowcharts showing a flow of a read verify operation in a single block BLK. In the description that follows, a description of the string unit SU will be omitted, to simplify the description.

First, the CPU 230 performs an erase operation of a selected block BLK to be a target of a write operation (S150). The subsequent processing from step S101 to step S106 is similar to that of the first embodiment described with reference to FIG. 8.

In a read verify operation, if an intra-channel ECC process for decoding has failed (S107_Yes), the memory controller 200 performs a tracking operation in cooperation with the memory chip 100 (S151).

If an intra-channel ECC process for decoding has not failed (S107_No), or if the absolute value of the shift value is not equal to or greater than the specified value as a result of the tracking operation (S152_No), the CPU 230 confirms whether the variable n is equal to "(the total number of word lines WL)−1" (S108).

If the variable n is not equal to "(the total number of the word lines WL)−1" (S108_No), namely, if the word line WLn is not the one that has been selected last in the block BLK, the processing advances to step S104, where the CPU 230 increments the variables n and If the variable n is equal to "(the total number of the word lines WL)−1" (S108_Yes), namely, if the word line. WLn is the one that has been selected last in the block BLK, the CPU 230 increments the variable m to satisfy m=m+1 (S109). That is, the variable m is equal to "(the total number of the word lines WL)−2". In other words, the word line WLm is the word line WL selected second to the last in the block BLK. At this time, the variable n is not incremented. The CPU 230 transmits a command set for a read process corresponding to the word line WLm to the memory chip 100.

Upon receiving the command set for a read process, the sequencer 15 performs a read process corresponding to the word line WLm (S110). The read data is transmitted to the memory controller 200. Subsequently, in the ECC circuit 260, an intra-channel ECC process for decoding of the read data is performed (S111).

If an intra-channel ECC process for decoding has failed (S112_Yes), the memory controller 200 performs a tracking operation in cooperation with the memory chip 100 (S153).

If an intra-channel ECC process for decoding has not failed (S112_No), or if the absolute value of the shift value is determined, as a result of the tracking operation, to be not equal to or greater than the specified value (S154_No), the CPU 230 increments the variable m to satisfy m=m+1 (S113). The value of the variable m is equal to "(the total number of the word lines WL)−1". In other words, the word line WLm is the word line WL selected last in the block BLK. At this time, the variable n is not incremented. The CPU 230 transmits a command set for a read process corresponding to the word line WLm to the memory chip 100.

Upon receiving the command set for a read process, the sequencer 15 performs a read process corresponding to the word line WLm (S114). The read data is transmitted to the memory controller 200. Subsequently, in the ECC circuit 260, an intra-channel ECC process for decoding of the read data is performed (S115).

If an intra-channel ECC process for decoding has failed (S116_Yes), the memory controller 200 performs a tracking operation in cooperation with the memory chip 100 (S155)

If an intra-channel ECC process for decoding has not failed (S116_No), or if the absolute value of the shift value is not equal to or greater than the specified value as a result of the tracking operation (S156_No), the CPU 230 confirms whether a refresh flag is set to "1" (S157). The refresh flag is a flag indicating whether or not a refresh operation has been performed within a prescribed number of cycles D. The refresh flag is used for determination of a bad blocking process. For example, if a refresh operation has been performed within the prescribed number of cycles D, "1" is set, and if a refresh operation has not been performed, "0" is set.

If the refresh flag is not set to "1" (S157_No), the CPU 230 completes a write operation and a read verify operation in the block ELK.

If the refresh flag is set to "1" (S157_Yes), the CPU 230 decrements the remaining number of cycles d, and sets d=d−1 (S158).

Subsequently, the CPU 230 confirms whether d=0 is satisfied (S159). That is, it is determined whether or not a refresh flag should be reset.

If d=0 is not satisfied (S159_No), namely, if the prescribed cycle number D has not been reached since performance of the previous refresh operation, the CPU 230 completes a write operation and a read verify operation in the block BLK.

If d=0 is satisfied (S159_Yes), namely, if the predetermined number of write/erase cycles set has been reached since performance of the previous refresh operation, the CPU 230 resets the refresh flag and sets it to "0". Thereafter, the CPU 230 completes a write operation and a read verify operation in the block ELK.

If the absolute value of the shift value is equal to or greater than the specified value at step S152, S154, or S156 (S152_Yes, S154_Yes, or S156_Yes), the CPU 230 confirms whether the refresh flag is set to "1" (S161).

If the refresh flag is not set to "1" (S161_No), the memory controller 200 performs a refresh operation, in cooperation with the memory chip 100 (S119). After the refresh operation, the CPU 230 sets the refresh flag to "1", and sets the remaining number of cycles to d=D (S162). Thereafter, the CPU 230 completes a write operation and a read verify operation in the block BLK.

If the refresh flag is set to "1" (S161_Yes), a bad blocking process is performed (S120). Thereafter, the CPU 230 completes a write operation and a read verify operation in the block BLK.

4.2 Second Example

Next, a second example will be explained. In the second example, a select word line WL of a write operation and a selected word line WL of a read verify operation are identical, similarly to the second embodiment. Determination of a refresh operation and a bad blocking process is similar to that of the first example of the fourth embodiment.

4.2.1 Flow of Read Verify Operation in Single Block

Figure 24:
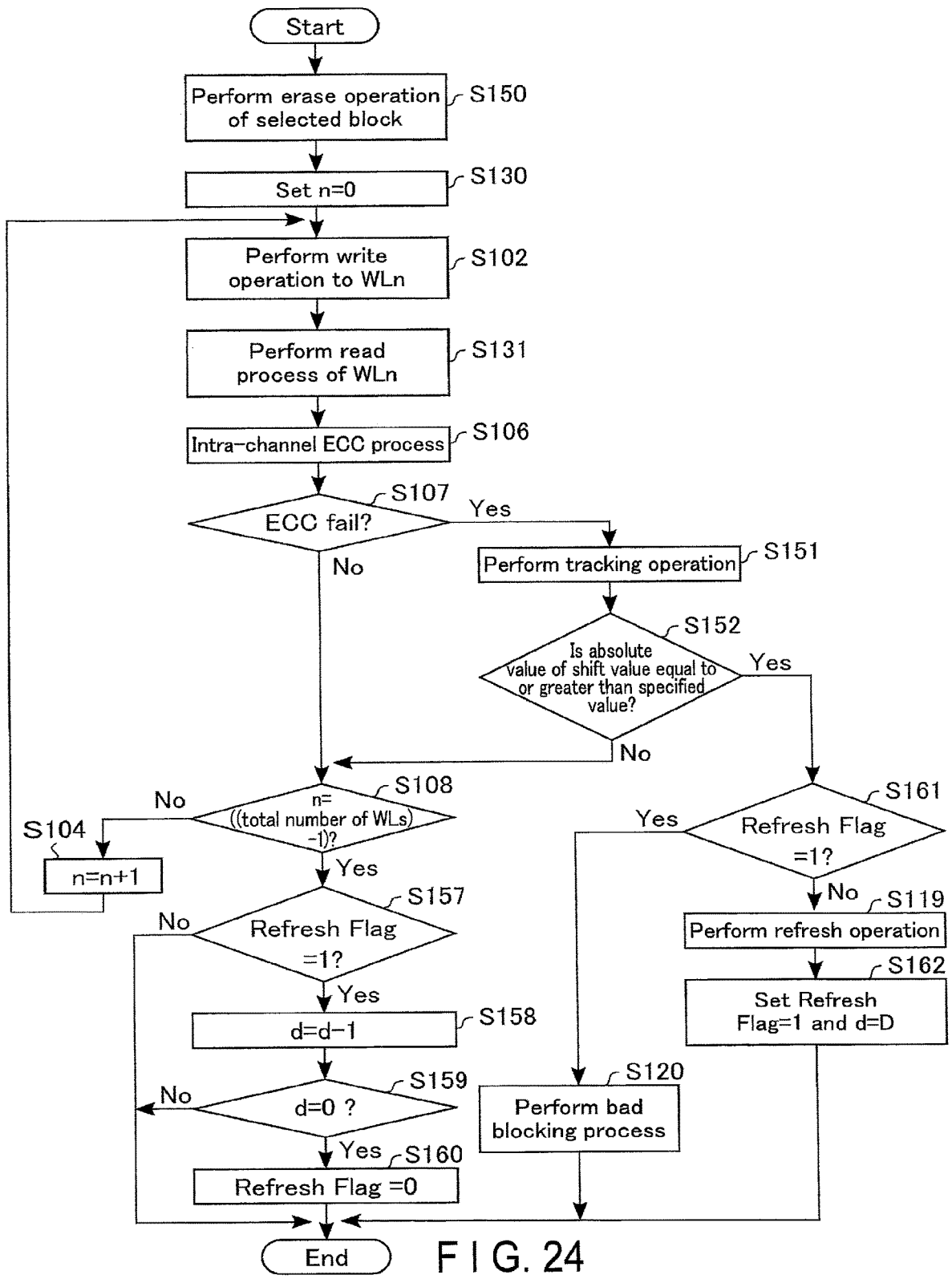
FIG. 24 is a flowchart showing a write operation and a read verify operation in a memory chip included in a memory system according to a second example of the fourth embodiment.

A flow of a read verify operation in a single write/erase cycle will be described with reference to FIG. 24, with a focus on a single block ELK. FIG. 24 is a flowchart showing a flow of a read verify operation in a single block BLK. In the description that follows, a description of the string unit SU will be omitted, to simplify the description.

First, the CPU 230 performs an erase operation of a selected block BLK to be a target of a write operation (S150).

The subsequent processing of steps S130, S102, S131, and S106 is similar to that of the second embodiment described with reference to FIG. 11.

If an intra-channel ECC process for decoding has failed (S107_Yes), the memory controller 200 performs a tracking operation in cooperation with the memory chip 100 (S151).

If an intra-channel ECC process for decoding has not failed (S105_No), or if the absolute value of the shift value is not equal to or greater than the specified value as a result of the tracking operation (S152_No), the CPU 230 confirms whether the variable n is equal to "(the total number of word lines WL)−1" (S108).

If the variable n is not equal to "(the total number of the word lines WL)−1" (S108_No), namely, if the word line WLn is not the one that has been selected last in the block BLK, the processing advances to S104, where the CPU 230 increments the variable n.

If the variable n is equal to "(the total number of the word lines WL)−1" (S108_Yes), namely, if the word line WLn is the one that has been selected last in the block BLK, the processing from step S157 to step S160 is performed, similarly to the first example of the fourth embodiment.

If the absolute value of the shift value is equal to or greater than the specified value at step S152 (S152_Yes), the processing of steps S161, S119, S162, and S120 is performed, similarly to the first example of the fourth embodiment.

4.3 Third Example

Next, a third example will be explained. In the third example, the variables n and m satisfy the relation of, for example, m=n−2, similarly to the first embodiment. Whether or not to perform a refresh operation is determined based on a result of an intra-channel ECC process for decoding. Whether or not to perform a bad blocking process is determined based on a prescribed number of cycles D. In the present example, a tracking operation is not performed.

4.3.1 Overall Flow of Read Verify Operation

Figure 25:
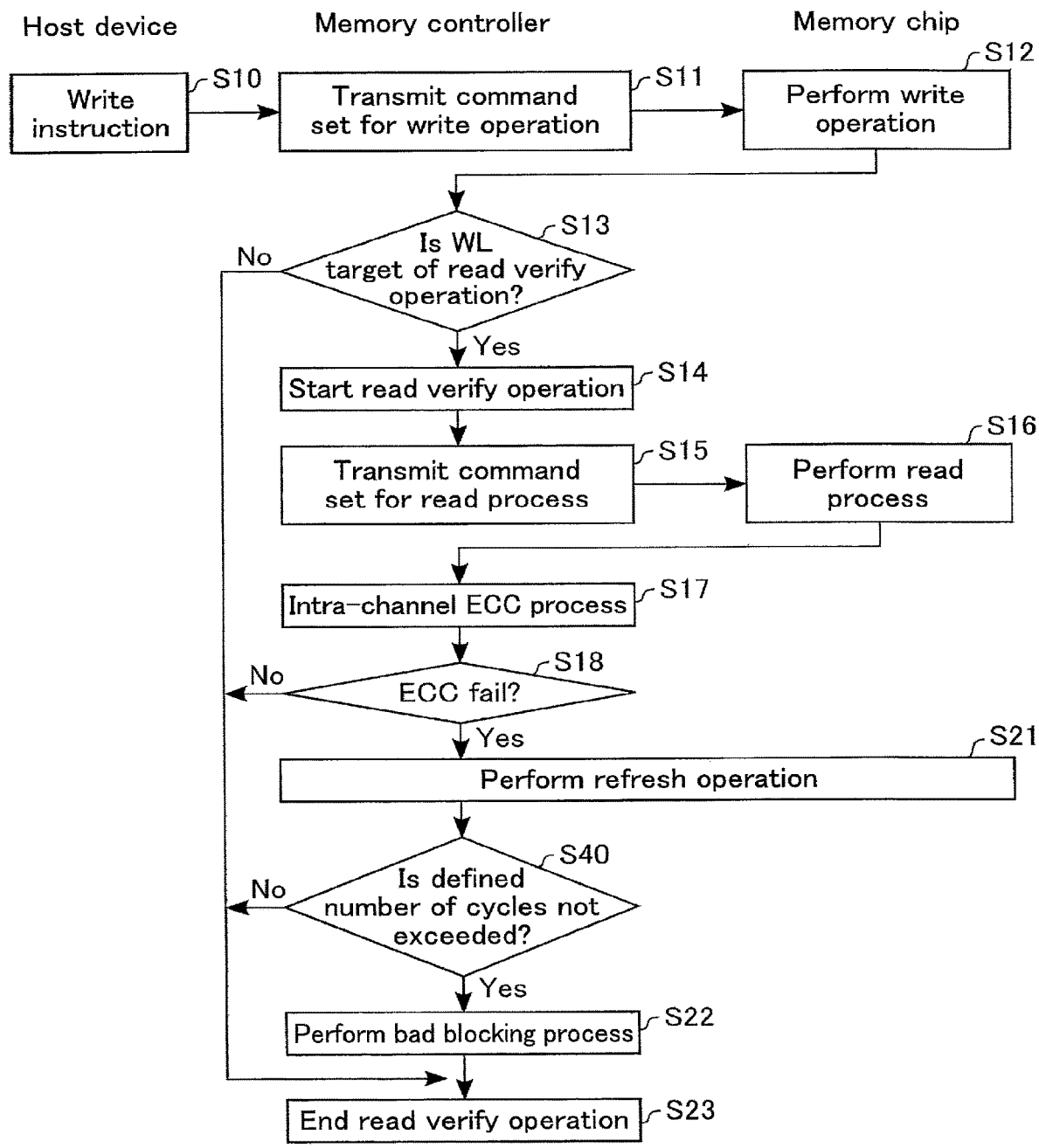
FIG. 25 is a flowchart showing a write operation and a read verify operation in a memory system according to a third example of the fourth embodiment.

First, an overall flow of a read verify operation will be described with reference to FIG. 25. FIG. 25 is a flowchart showing an overall flow of a read verify operation. A read verify operation in the present example includes a read process, an intra-channel ECC process for decoding, a refresh operation, and a bad blocking process.

The processing from step S10 to step S17 is similar to that of the first embodiment described with reference to FIG. 7.

If the intra-channel ECC process for decoding has not failed (S18_No), the memory controller 200 completes a read verify operation (S23). On the other hand, if the intra-channel ECC process for decoding has failed (S18_Yes), a refresh operation is performed (S21).

After the performance of the refresh operation, the memory controller 200 confirms whether the refresh operation has been performed within a prescribed number of cycles D since performance of the previous refresh operation (S40).

If a refresh operation has not been performed within the prescribed number of cycles D (S40_No), more specifically, if a refresh operation has not been previously performed in the block BLK, or if the prescribed number of cycles D has been reached since performance of the previous refresh operation, the memory controller 200 completes the read verify operation (S23).

If a refresh operation has been performed within the prescribed number of cycles D (S40_Yes), the memory controller 200 performs a bad blocking process of the block BLK (S22). After the bad blocking process has been completed, the memory controller 200 completes the read verify operation (S23).

4.3.2 Flow of Read Verify Operation in Single Block

Figure 26:
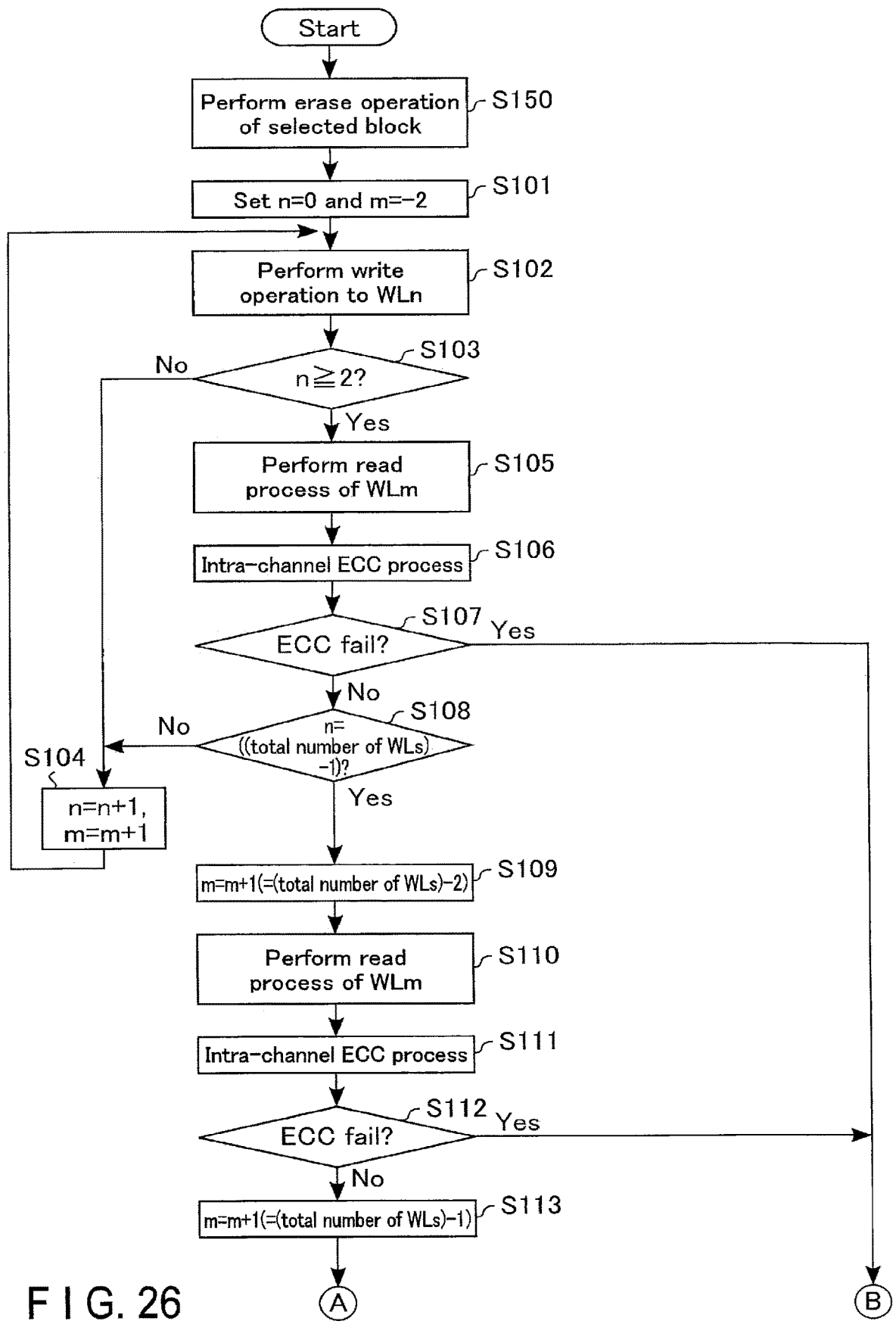

Next, a flow of a read verify operation in a single write/erase cycle will be described with reference to FIGS. 26 and 27, with a focus on a single block BLK. FIGS. 26 and 27 are flowcharts showing a flow of a read verify operation in a single block BLK. In the description that follows, a description of the string unit SU will be omitted, to simplify the description.

The processing in steps S150 and S101 to S106 is similar to that of the first example of the fourth embodiment described with reference to FIG. 22.

If the intra-channel ECC process for decoding has not failed (S107_No), the CPU 230 confirms whether the variable n is equal to "(the total number of the word lines WL)−1" (S108).

If the variable n is not equal to "(the total number of the word lines WL)−1" (S108_No), the processing advances to S104, where the CPU 230 increments the variables n and m.

If the variable n is equal to "(the total number of the word lines WL)−1" (S107_Yes), the CPU 230 increments the variable m to satisfy m=m+1 (S109). The value of the variable m is equal to "(the total number of the word lines WL)−2". In other words, the word line WLm is the word line WL selected second to the last in the block BLK. At this time, the variable n is not incremented. The CPU 230 transmits a command set for a read process corresponding to the word line WLm to the memory chip 100.

Upon receiving the command set for a read process, the sequencer 15 performs a read process corresponding to the word line WLm (S110). The read data is transmitted to the memory controller 200. Subsequently, in the ECC circuit 260, an intra-channel ECC process for decoding of the read data is performed (S111).

If the intra-channel ECC process for decoding has not failed (S112_No), the CPU 230 increments the variable m to satisfy m=m+1 (S113) The value of the variable m is equal to "(the total number of the word lines WL)−1". In other words, the word line WLm is the word line WL selected last in the block BLK. At this time, the variable n is not incremented. The CPU 230 transmits a command set for a read process corresponding to the word line WLm to the memory chip 100.

Upon receiving the command set for a read process, the sequencer 15 performs a read process corresponding to the word line WLm (S114). The read data is transmitted to the memory controller 200. Subsequently, in the ECC circuit 260, an intra-channel ECC process for decoding of the read data is performed (S115).

If the intra-channel ECC process for decoding has not failed (S116_No), the processing of steps S157 to S160 is performed, similarly to the first example of the fourth embodiment.

If the intra-channel ECC process for decoding has failed at step S107, S112, or S116 (S107_Yes, S112_Yes, or S116_Yes), the processing of steps S161, S119, S162, and S120 is performed, similarly to the first example of the fourth embodiment.

4.4 Fourth Example

Next, a fourth example will be described. In the fourth example, a select word line WL of a write operation and a selected word line WL of a read verify operation are identical, similarly to the second embodiment. Determination of a refresh operation and a bad blocking process is similar to that of the third example of the fourth embodiment.

4.4.1 Flow of Read Verify Operation in Single Block

A flow of a read verify operation in a single write/erase cycle will be described with reference to FIG. 28, with a focus on a single block BLK. FIG. 28 is a flowchart showing a flow of a read verify operation in a single block BLK. In the description that follows, a description of the string unit SU will be omitted, to simplify the description.

Unlike the second example of the fourth embodiment described with reference to FIG. 24, if an intra-channel ECC process for decoding has failed (S107_Yes), the CPU 230 does not perform a tracking operation, and confirms whether the refresh flag is set to "1" (S161). The other processes are similar to that of the second example of the fourth embodiment described with reference to FIG. 24.

5. Fifth Embodiment

Next, a fifth embodiment will be described. In the fifth embodiment, a case will be described where the power source of the memory system 1 has been interrupted during a read verify operation and a read verify operation has not been completed.

5.1 Overall Flow of Read Verify Operation

An overall flow of a read verify operation will be described with reference to FIG. 29. FIG. 29 is a flowchart showing an overall flow of a read verify operation. A read verify operation in the present embodiment includes a read process, an intra-channel ECC process for decoding, and a refresh operation.

The processing from step S10 to step S12 is similar to that in FIG. 7 of the first embodiment.

After the completion of the write operation, if the selected word line WLn is a target of a read verify operation, the memory controller 200 starts a read verify operation (S50).

For example, the power supply may be interrupted during a read verify operation (S51). In this case, status information indicating that a read verify operation is suspended is stored in the memory controller 200 or the memory chip 100.

After the power supply has returned (S52), the memory controller 200 confirms status information indicating the suspension of a read verify operation, and resumes the read verify operation (S53). More specifically, the memory controller 200 transmits, for example, a command set for a read process to the memory chip 100 (S15).

Upon receiving the command set for a read process, the memory chip 100 performs a read process (S16). The read data is transmitted to the memory controller 200.

Upon receiving the read data, the memory controller 200 performs, in the ECC circuit 260, an intra-channel ECC process for decoding (S17).

If the intra-channel ECC process for decoding has failed (S18_Yes), the memory controller 200 takes the initiative to perform a refresh operation (S21).

On the other hand, if the intra-channel ECC process for decoding has not failed (S17_No), or after the refresh operation has been completed in step S21, the memory controller 200 completes the read verify operation (S23).

If the power supply has been interrupted during a read verify operation, it is highly likely that, in a read verify operation after recovery of the power supply, an intra-channel ECC process for decoding has failed due to the effect of data retention (an accidental failure). Thus, even if an intra-channel ECC process for decoding has failed, it is highly likely that the failure is not a physical failure, and the memory controller 200 determines whether or not a refresh operation has been performed, and does not perform determination on a bad blocking process.

5.2 Effects of Present Embodiment

According to the configuration of the present embodiment, it is possible to obtain effects similar to those of the first to fourth embodiments.

Moreover, according to the configuration of the present embodiment, it is possible to resume a read verify operation after recovery of the power supply. Furthermore, according to the configuration of the present embodiment, it is possible to avoid the risk of multiple bad blocks that may occur when a process similar to that of the first to fourth embodiments is performed after recovery of the power supply.

6. Modification

A memory system according to the above embodiment includes: a memory chip (100) including a first memory block (BLK) and a plurality of first word lines (WL), the first memory block including a first memory string (NS) which includes a plurality of first memory cells (MC) that are coupled in series, the first word lines being respectively coupled to gates of the first memory cells; a memory controller (200) coupled to an external device, controlling the memory chip, and capable of performing an error checking and correcting (ECC) process of data read from the memory chip. When a write instruction is received from the external device, the memory controller is configured to perform a write operation on a second memory cell which is one of the first memory cells, and to perform a read verify operation including a read process and the ECC process on a third memory cell which is one of the first memory cells.

According to the above-described embodiment, it is possible to provide a memory system with improved reliability.

The embodiments are not limited to those described above, and may be variously modified. For example, the first to fifth embodiments may be combined wherever possible.

The term "couple" in the above-described embodiments includes, for example, indirect coupling with a transistor, a resistor, etc. interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
    a memory chip including a first memory block and a plurality of first word lines, the first memory block including a first memory string which includes a plurality of first memory cells that are coupled in series, the first word lines being respectively coupled to gates of the first memory cells;
    a memory controller coupled to an external device, controlling the memory chip, and capable of performing an error checking and correcting (ECC) process of data read from the memory chip, wherein
    when a write instruction is received from the external device, the memory controller is configured to perform a write operation on a second memory cell which is one of the first memory cells, and to perform a read verify operation including a read process and the ECC process on a third memory cell which is one of the first memory cells.

2. The memory system according to claim 1, wherein the second memory cell and the third memory cell are identical.

3. The memory system according to claim 1, wherein the second memory cell and the third memory cell are different from each other, and the third memory cell stores data before the write operation to the second memory cell is performed.

4. The memory system according to claim 1, wherein
the read verify operation further includes a tracking operation of searching for a shift value of a read voltage, and
the memory controller is configured to perform the tracking operation when the ECC process is determined to have failed.

5. The memory system according to claim 1, wherein
the memory chip further includes a second memory block and a plurality of second word lines, the second memory block including a second memory string which includes a plurality of fourth memory cells that are coupled in series, the second word lines being respectively coupled to gates of the fourth memory cells, and
the memory controller is configured to perform a refresh operation to write valid data contained in the first memory block into the second memory block on the basis of a determination result of the read verify operation in the first memory block.

6. The memory system according to claim 5, wherein
the read verify operation further includes a tracking operation of searching for a shift value of a read voltage, and
the memory controller is configured to perform the tracking operation when the ECC process is determined to have failed, and to perform the refresh operation on the basis of the shift value of the read voltage as a result of the tracking operation.

7. The memory system according to claim 5, wherein
the memory controller is configured to perform a bad blocking process of invalidating the first memory block when the refresh operation is performed multiple times within a predetermined number of repetitions of the write operation and an erase operation in the first memory block.

8. The memory system according to claim 1, wherein
the memory controller is configured to perform a bad blocking process of invalidating the first memory block on the basis of a determination result of the read verify operation.

9. The memory system according to claim 8, wherein
the read verify operation further includes a tracking operation of searching for a shift value of a read voltage, and
the memory controller is configured to perform the tracking operation when the ECC process is determined to have failed, and to perform the bad blocking process when the shift value of the read voltage falls outside a predetermined range of values as a result of the tracking operation.

10. The memory system according to claim 1, further comprising:
a plurality of memory chips, wherein
each of the memory chips further includes a second memory block and a plurality of second word lines, the second memory block including a second memory string which includes a plurality of fourth memory cells that are coupled in series, the second word lines being respectively coupled to the fourth memory cells,
the memory controller is configured to generate first data containing one or more items of user data and an error-correcting code attached to the user data, and to write the generated first data into a plurality of memory chips in a distributed manner,
when one of a plurality of segments of second data which is obtained by dividing the first data and which has a first coding rate is written into the first memory block, and one of a plurality of segments of third data which is obtained by dividing the first data and which has a second coding rate lower than the first coding rate is written into the second memory block, the memory controller is configured to perform the read verify operation after the write operation to the first memory block, and to not perform the read verify operation after the write operation to the second memory block.

11. The memory system according to claim 1, wherein
the first memory string further includes:
a first select transistor, one end of the first select transistor being coupled to one end of the first memory cells that are coupled in series, other end of the first select transistor being coupled to a source line,
a plurality of fifth memory cells coupled in series, one end of the fifth memory cells being coupled to other end of the first memory cells,
a second select transistor, one end of the second select transistor being coupled to other end of the fifth memory cells that are coupled in series, other end of the second select transistor being coupled to a bit line,
the memory chip further includes:
a first select gate line coupled to a gate of the first select transistor;
a plurality of third word lines respectively coupled to gates of the fifth memory cells;
a second select gate line coupled to a gate of the second select transistor;
a first memory pillar including the first memory cells and the first select transistors; and
a second memory pillar including the fifth memory cells and the second select transistors,
the first memory pillar passes through the first word lines and the first select gate line, and one end of the first memory pillar is coupled to the source line,
the second memory pillar passes through the second select gate line and the third word lines, one end of the second memory pillar is coupled to the first memory pillar, and other end of the second memory pillar is coupled to the bit line,
the first word lines include a fourth word line adjacent to the first select gate line and a fifth word line different from the fourth word line,
the third word lines include a sixth word line and a seventh word line, the sixth word line being arranged closest to the first word lines among the third word lines, the seventh word line being different from the sixth word line,
the first memory cells include a sixth memory cell that is coupled to the fourth word line and a seventh memory cell that is coupled to the fifth word line,
the fifth memory cells include an eighth memory cell that is coupled to the sixth word line and a ninth memory cell that is coupled to the seventh word line, and
the memory controller is configured to perform the read verify operation on at least one of the sixth memory cell and the eighth memory cell, and to not perform the read verify operation on at least one of the seventh memory cell and the ninth memory cell.

12. The memory system according to claim 4, wherein
the memory controller performs multiple read operations with different read voltages for one state in the tracking operation.

13. The memory system according to claim 5, wherein
the memory controller is configured to perform a bad blocking process of invalidating the first memory block on the basis of a determination result of the read verify operation.

14. The memory system according to claim 13, wherein
the read verify operation further includes a tracking operation of searching for a shift value of a read voltage, and the memory controller is configured to perform the tracking operation when the ECC process is determined to have failed, and to perform the refresh operation when the shift value of the read voltage is determined to fall within a predetermined range of values as a result of the tracking operation, and to perform the bad blocking process when the shift value of the read voltage is determined to fall outside the predetermined range of values.

15. The memory system according to claim 13, wherein
the memory controller is configured to perform the refresh operation when the ECC process is determined to have failed, and to perform a bad blocking process of invalidating the first memory block when the refresh operation is performed multiple times within a predetermined number of repetitions of the write operation and an erase operation in the first memory block.

16. The memory system according to claim 1, wherein
the first block further includes a third memory string which includes a plurality of tenth memory cells that are coupled in series, the tenth memory cells are respectively coupled to the first word lines, and when a write instruction is received from the external device, the memory controller is configured to perform a write operation on an eleventh memory cell which is one of the first memory cells and on a twelfth memory cell which is one of the tenth memory cells, to perform the read verify operation on a thirteenth memory cell which is one of the first memory cells, and to not perform the read verify operation on a fourteenth memory cell which is one of the tenth memory cells.

17. The memory system according to claim 16, wherein
the eleventh and twelfth memory cells are coupled to an eighth word line which is one of the first word lines, and the thirteenth and fourteenth memory cells are coupled to a ninth word line which is one of the first word lines.

18. The memory system according to claim 1, wherein
the first memory cells are capable of storing data on at least a first bit and a second bit, and the memory controller is configured to perform the read verify operation on the first bit, and to not perform the read verify operation on the second bit.

19. The memory system according to claim 1, wherein
the first block further includes a fourth memory string which includes a plurality of fifteenth memory cells that are coupled in series, the first memory string further includes a third select transistor that is coupled to one end of the first memory cells, the fourth memory string further includes a fourth select transistor that is coupled to one end of the fifteenth memory cells, the memory chip further includes a third select gate line that is coupled to a gate of the third select transistor, and a fourth select gate line that is coupled to a gate of the fourth select transistor and that is different from the third select gate line, the memory controller is configured to perform the read verify operation on the first memory string, and to not perform the read verify operation on the fourth memory string.

20. The memory system according to claim 1, wherein
each of the first memory cells includes a charge storage layer.

* * * * *